(12) United States Patent
Kim et al.

(10) Patent No.: US 11,818,918 B2
(45) Date of Patent: Nov. 14, 2023

(54) DISPLAY APPARATUS

(71) Applicant: Samsung Display Co., Ltd., Yongin-si (KR)

(72) Inventors: Sanghoon Kim, Yongin-si (KR); Sangshin Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 51 days.

(21) Appl. No.: 17/446,526

(22) Filed: Aug. 31, 2021

(65) Prior Publication Data

US 2022/0181412 A1 Jun. 9, 2022

(30) Foreign Application Priority Data

Dec. 9, 2020 (KR) .................... 10-2020-0171624

(51) Int. Cl.
*G09G 5/10* (2006.01)
*H10K 59/122* (2023.01)
*G09G 3/3233* (2016.01)
*H10K 50/86* (2023.01)
*H10K 71/00* (2023.01)
(Continued)

(52) U.S. Cl.
CPC ......... *H10K 59/122* (2023.02); *G09G 3/3233* (2013.01); *H10K 50/865* (2023.02); *H10K 71/00* (2023.02); *G09G 2300/0452* (2013.01); *G09G 2300/0842* (2013.01); *G09G 2354/00* (2013.01); *H10K 59/38* (2023.02); *H10K 59/40* (2023.02)

(58) Field of Classification Search
CPC . H01L 27/3246; H01L 51/5284; H01L 51/56; H01L 27/322; H01L 27/323; G09G 3/3233; G09G 2300/0452; G09G 2300/0842; G09G 2354/00; H10K 59/122; H10K 59/38; H10K 59/40; H10K 71/00; H10K 50/865
USPC ........................................................ 345/694
See application file for complete search history.

(56) References Cited

U.S. PATENT DOCUMENTS 10,692,940 B2 6/2020 Liu et al.
10,861,905 B2 * 12/2020 Wang .................. G09G 3/3225
(Continued)

FOREIGN PATENT DOCUMENTS

CN 109427850 A 3/2019
CN 110379836 A 10/2019
(Continued)

OTHER PUBLICATIONS

EPO Extended European Search Report dated Jul. 25, 2022, issued in corresponding European Patent Application No. 21213262.5 (15 pages).

*Primary Examiner* — Jennifer T Nguyen
(74) *Attorney, Agent, or Firm* — Lewis Roca Rothgerber Christie LLP

(57) ABSTRACT

A display apparatus includes: a substrate; a plurality of first pixels on the substrate arranged along a first direction and a second direction intersecting with the first direction and configured to emit light of a first color; and a plurality of second pixels arranged on the substrate arranged along the first direction and the second direction and configured to emit light of the first color, wherein each of the plurality of first pixels includes a plurality of first partial pixels, and the plurality of first pixels and the plurality of second pixels are alternately arranged in each of the first direction and the second direction.

22 Claims, 14 Drawing Sheets

(51) Int. Cl.
*H10K 59/38* (2023.01)
*H10K 59/40* (2023.01)

(56) References Cited

U.S. PATENT DOCUMENTS

| | | |
|---|---|---|
| 2017/0148396 A1 | 5/2017 | Chen et al. |
| 2017/0337863 A1 | 11/2017 | Chang |
| 2019/0096962 A1 * | 3/2019 | Han .................. H01L 51/56 |
| 2020/0227508 A1 | 7/2020 | Kim et al. |

FOREIGN PATENT DOCUMENTS

| | | | | |
|---|---|---|---|---|
| KR | 10-2018-0135342 A | 12/2018 | | |
| KR | 10-2020-0087384 A | 7/2020 | | |
| KR | WO2022014843 | * 5/2021 | ........... G09G 3/3208 |
| WO | 2022/014843 A1 | 1/2022 | | |

* cited by examiner

DISPLAY APPARATUS

CROSS-REFERENCE TO RELATED APPLICATION

The present application claims priority to and the benefit of Korean Patent Application No. 10-2020-0171624, filed on Dec. 9, 2020, in the Korean Intellectual Property Office, the entire content of which is hereby incorporated by reference.

BACKGROUND

1. Field

Aspects of one or more embodiments relate to display apparatuses.

2. Description of the Related Art

Display apparatuses may visually display data. A display apparatus may be used as a display for relatively small electronic devices such as mobile phones or may be used as a display for relatively large electronic devices such as televisions.

Such a display apparatus may include a substrate divided into a display area and a non-display area, and a gate line and a data line are formed to be insulated from each other in the display area. A plurality of pixel regions may be defined in the display area, and pixels respectively arranged in the plurality of pixel regions emit light by receiving electrical signals from a gate line and a data line intersecting each other to display an image to the outside. Each pixel region (or each of the pixel regions) includes a thin film transistor and a pixel electrode electrically connected to the thin film transistor, and an opposite electrode may be commonly provided for the pixel regions. The non-display area may include various lines for transmitting electrical signals to pixels in the display area, pads to which a gate driver, a data driver, and a controller may be connected, and the like.

Recently, display apparatuses have been used for various purposes. Also, as display apparatuses have become thinner and lighter, their range of use has widened. Accordingly, researches have been actively conducted on the manufacture of display apparatuses, and various attempts have been made to reduce additional equipment and increase yield.

The above information disclosed in this Background section is only for enhancement of understanding of the background and therefore the information discussed in this Background section does not necessarily constitute prior art.

SUMMARY

Aspects of one or more embodiments include a display apparatus in which a manufacturing defect rate of a deposition mask used to form an emission layer of a display element may be reduced and propagation of light emitted from the display element in a direction inclined to the front of the display apparatus may be reduced. However, these are merely examples and the scope of embodiments according to the present disclosure are not limited thereto.

Additional aspects will be set forth in part in the description which follows and, in part, will be apparent from the description, or may be learned by practice of the presented embodiments.

According to one or more embodiments, a display apparatus includes a substrate, a plurality of first pixels arranged on the substrate in a first direction and a second direction intersecting with the first direction and emitting light of a first color, and a plurality of second pixels arranged on the substrate in the first direction and the second direction and emitting light of the first color, wherein each of the plurality of first pixels includes a plurality of first partial pixels, and the plurality of first pixels and the plurality of second pixels are alternately arranged in each of the first direction and the second direction.

According to some embodiments, a light emission area of each of the plurality of first partial pixels may be less than a light emission area of each of the plurality of second pixels in a plan view.

According to some embodiments, a sum of amounts of light of the first color emitted, when a signal corresponding to a first gray scale value is input to one first pixel among the plurality of first pixels, by a plurality of first partial pixels included in the one first pixel may be substantially equal to a sum of amounts of light of the first color emitted, when a signal corresponding to the first gray scale value is input to one second pixel among the plurality of second pixels, by the one second pixel.

According to some embodiments, a first gap of the plurality of first pixels in the first direction may be substantially equal to a second gap of the plurality of second pixels in the first direction.

According to some embodiments, a third gap of the plurality of first pixels in the second direction may be substantially equal to a fourth gap of the plurality of second pixels in the second direction.

According to some embodiments, the display apparatus may further include a plurality of first pixel circuits respectively driving the plurality of first pixels, wherein each of the plurality of first pixel circuits may commonly drive a plurality of first partial pixels included in a corresponding first pixel among the plurality of first pixels.

According to some embodiments, the display apparatus may further include a plurality of second pixel circuits respectively driving the plurality of second pixels, wherein each of the plurality of first pixel circuits and the plurality of second pixel circuits may include a driving transistor substantially having a same channel characteristic.

According to some embodiments, the display apparatus may further include a plurality of third pixels arranged on the substrate in the first direction and the second direction and emitting light of a second color, and a plurality of fourth pixels arranged on the substrate in the first direction and the second direction and emitting light of the second color, wherein each of the plurality of third pixels may include a plurality of second partial pixels, and the plurality of third pixels and the plurality of fourth pixels may be respectively arranged between two first pixels adjacent in a third direction among the plurality of first pixels and may be alternately arranged in the third direction.

According to some embodiments, a first gap of the plurality of third pixels in the first direction may be substantially equal to a second gap of the plurality of fourth pixels in the first direction, and a third gap of the plurality of third pixels in the second direction may be substantially equal to a fourth gap of the plurality of fourth pixels in the second direction.

According to some embodiments, the display apparatus may further include a plurality of third pixel circuits respectively driving the plurality of third pixels, and a plurality of fourth pixel circuits respectively driving the plurality of fourth pixels, wherein each of the plurality of third pixel circuits may commonly drive a plurality of second partial pixels included in a corresponding third pixel among the plurality of third pixels, and the plurality of fourth pixel circuits may substantially have a same circuit configuration as the plurality of third pixel circuits.

According to some embodiments, the display apparatus may further include a plurality of fifth pixels arranged on the substrate in the first direction and the second direction and emitting light of a third color, and a plurality of sixth pixels arranged on the substrate in the first direction and the second direction and emitting light of the third color, wherein each of the plurality of fifth pixels may include a plurality of third partial pixels, and the plurality of fifth pixels and the plurality of sixth pixels may be respectively arranged between two first pixels adjacent in a fourth direction among the plurality of first pixels and may be alternately arranged in the fourth direction.

According to some embodiments, the plurality of third pixels and the plurality of fifth pixels may be alternately arranged in the first direction, the plurality of fourth pixels and the plurality of sixth pixels may be arranged in the first direction, the plurality of third pixels and the plurality of sixth pixels may be alternately arranged in the second direction, and the plurality of fourth pixels and the plurality of fifth pixels may be alternately arranged in the second direction.

According to some embodiments, the display apparatus may further include a controller receiving an input of a signal for selecting an operation mode, driving the plurality of first pixels and the plurality of second pixels when the operation mode is a first mode, and driving the plurality of first pixels and deactivating the plurality of second pixels when the operation mode is a second mode.

According to some embodiments, the display apparatus may further include a transmission layer on the plurality of first pixels and the plurality of second pixels, and a light blocking layer on the transmission layer, wherein the light blocking layer may include a plurality of opening portions respectively corresponding to the plurality of first partial pixels.

According to some embodiments, the light blocking layer may be arranged over a first area in which the plurality of first pixels are arranged, and may not overlap a second area in which the plurality of second pixels are arranged.

According to some embodiments, the light blocking layer may include a plurality of light blocking patterns substantially extending in the first direction, and the plurality of light blocking patterns may be spaced apart from each other in the second direction.

According to some embodiments, each of the light blocking patterns may have a zigzag shape.

According to one or more embodiments, a display apparatus includes a first pixel emitting light of a first color and including a plurality of first partial pixels that are commonly driven, a second pixel emitting light of the first color, a third pixel emitting light of a second color and including a plurality of second partial pixels that are commonly driven, a fourth pixel emitting light of the second color, a fifth pixel emitting light of a third color and including a plurality of third partial pixels that are commonly driven, and a sixth pixel that emits light of the third color.

According to some embodiments, the display apparatus may further include a controller receiving an input of a signal for selecting an operation mode, driving the first pixel, the second pixel, the third pixel, the fourth pixel, the fifth pixel, and the sixth pixel when the operation mode is a first mode, and driving the first pixel, the third pixel, and the fifth pixel and deactivating the second pixel, the fourth pixel, and the sixth pixel when the operation mode is a second mode.

According to some embodiments, the first pixel and the second pixel may be adjacent in a first direction, the third pixel and the sixth pixel may be adjacent in the first direction, and the fifth pixel and the fourth pixel may be adjacent in the first direction.

According to some embodiments, the third pixel may be located between the second pixel and the fifth pixel and may be located between the first pixel and the sixth pixel.

According to some embodiments, the display apparatus may further include a transmission layer on the first to sixth pixels, and a light blocking layer on the transmission layer, wherein the light blocking layer may include a plurality of openings respectively corresponding to the plurality of first partial pixels, the plurality of second partial pixels, and the plurality of third partial pixels.

According to some embodiments, the light blocking layer may be arranged on a first area in which the first pixel, the third pixel, and the fifth pixel are arranged, and may not overlap a second area in which the second pixel, the fourth pixel, and the sixth pixel are arranged.

Other aspects, features, and characteristics other than those described above will become more apparent from the following detailed description, the appended claims, and the accompanying drawings.

These general and particular aspects may be implemented by using systems, methods, computer programs, or any combinations of systems, methods, and computer programs.

BRIEF DESCRIPTION OF THE DRAWINGS

The above and other aspects, features, and characteristics of certain embodiments will be more apparent from the following description taken in conjunction with the accompanying drawings, in which.

DETAILED DESCRIPTION

Figure 1:
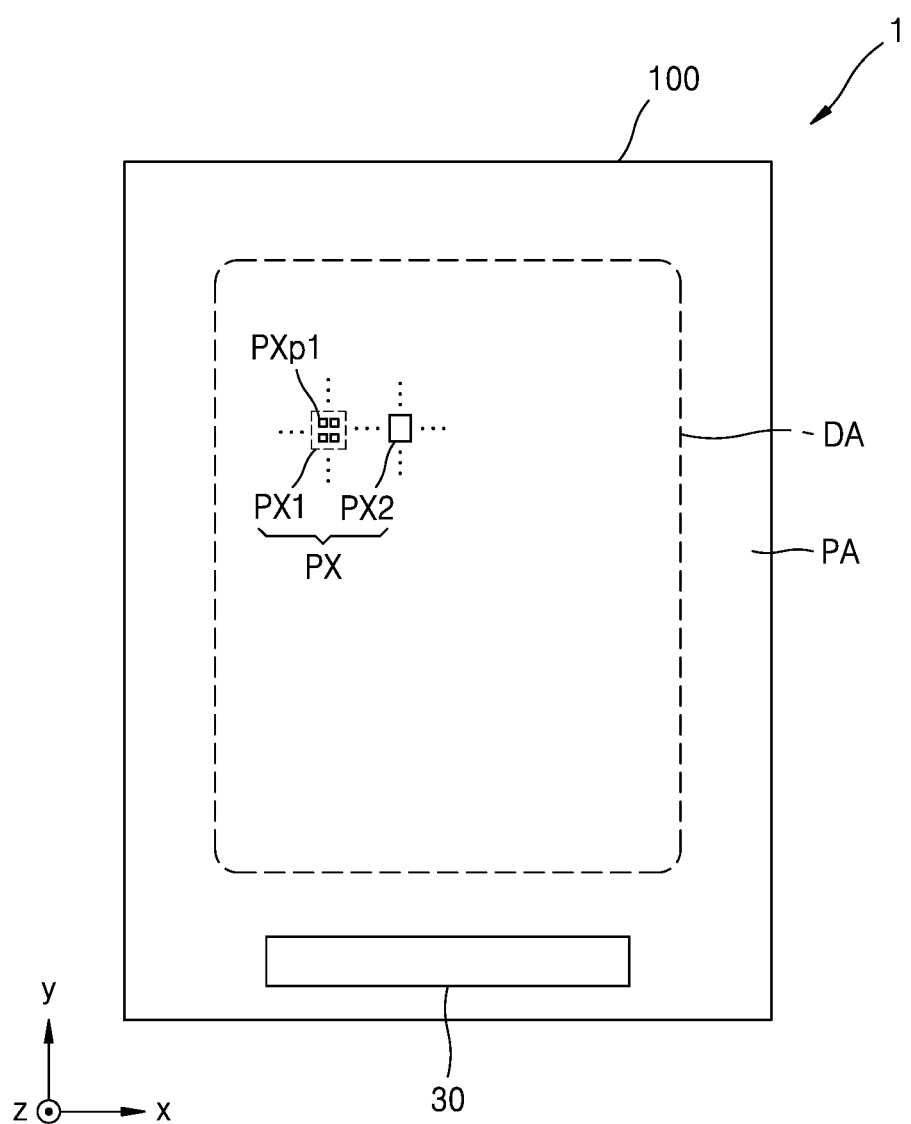
FIG. 1 is a plan view schematically illustrating a display apparatus according to some embodiments.

Reference will now be made in more detail to aspects of some embodiments, which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

The disclosure may include various embodiments and modifications, and certain embodiments thereof are illustrated in the drawings and will be described herein in detail. The effects and features of the disclosure and the accomplishing methods thereof will become apparent from the embodiments described below in detail with reference to the accompanying drawings. However, embodiments according to the present disclosure are not limited to the embodiments described below and may be embodied in various modes.

Hereinafter, embodiments will be described in more detail with reference to the accompanying drawings, and in the following description, like reference numerals will denote like elements and redundant descriptions thereof will be omitted for conciseness.

It will be understood that although terms such as "first" and "second" may be used herein to describe various components, these components should not be limited by these terms and these terms are only used to distinguish one component from another component.

As used herein, the singular forms "a," "an," and "the" are intended to include the plural forms as well, unless the context clearly indicates otherwise.

Also, it will be understood that the terms "comprise," "include," and "have" used herein specify the presence of stated features or components, but do not preclude the presence or addition of one or more other features or components.

It will be understood that when a layer, region, or component is referred to as being "on" another layer, region, or component, it may be "directly on" the other layer, region, or component or may be "indirectly on" the other layer, region, or component with one or more intervening layers, regions, or components therebetween.

Sizes of elements in the drawings may be exaggerated for convenience of description. In other words, because the sizes and thicknesses of elements in the drawings are arbitrarily illustrated for convenience of description, embodiments according to the present disclosure are not limited thereto.

When a certain embodiment may be implemented differently, a particular process order may be performed differently from the described order. For example, two consecutively described processes may be performed substantially at the same time or may be performed in an order opposite to the described order.

As used herein, "A and/or B" represents the case of A, B, or A and B. Also, "at least one of A and B" represents the case of A, B, or A and B.

It will be understood that when a layer, region, or component is referred to as being "connected to" another layer, region, or component, it may be "directly connected to" the other layer, region, or component or may be "indirectly connected to" the other layer, region, or component with one or more intervening layers, regions, or components therebetween. For example, it will be understood that when a layer, region, or component is referred to as being "electrically connected to" another layer, region, or component, it may be "directly electrically connected to" the other layer, region, or component and/or may be "indirectly electrically connected to" the other layer, region, or component with one or more intervening layers, regions, or components therebetween.

The x axis, the y axis, and the z axis are not limited to three axes of the rectangular coordinate system and may be interpreted in a broader sense. For example, the x axis, the y axis, and the z axis may be perpendicular to one another or may represent different directions that are not perpendicular to one another.

FIG. 1 is a plan view schematically illustrating a display apparatus according to some embodiments.

Referring to FIG. 1, a display apparatus 1 may include a display area DA where images are displayed and a peripheral area PA arranged around the display area DA. The display apparatus 1 may display images to the outside by using light emitted from the display area DA.

A substrate 100 may include various materials such as glass, metal, or plastic. According to some embodiments, the substrate 100 may include a flexible material. Here, the flexible material may refer to a substrate that may be relatively easily bent, curved, folded, or rolled. The substrate 100 of the flexible material may include ultra-thin glass, metal, or plastic.

Pixels PX including various display elements such as organic light emitting diodes (OLED) may be located in the display area DA of the substrate 100. The pixel PX may include a plurality of pixels PX, and the plurality of pixels PX may be arranged in various forms such as stripe arrangement, pentile arrangement, or mosaic arrangement to implement an image.

The pixel PX may include a first pixel PX1 and a second pixel PX2.

The first pixel PX1 may include a plurality of first partial pixels PXp1. Although FIG. 1 illustrates that the first pixel PX1 includes four first partial pixels PXp1, this is merely an example and the number of first partial pixels PXp1 included in the first pixel PX1 may vary according to embodiments. For example, the number of first partial pixels PXp1 included in the first pixel PX1 may be two, three, or five or more.

The viewing angle of light emitted from the first pixel PX1 may be narrower than the viewing angle of light emitted from the second pixel PX2. A light blocking layer for narrowing the viewing angle of emitted light may be arranged on the first pixel PX1.

According to some embodiments, the first pixel PX1 and the second pixel PX2 may emit light of the same color. For example, the display apparatus 1 may include the first pixel PX1 and the second pixel PX2 that emit light of a first color. The display apparatus 1 may further include a first pixel PX1 and a second pixel PX2 emitting light of a second color, and a first pixel PX1 and a second pixel PX2 emitting light of a third color.

According to some embodiments, the size of each of the plurality of first partial pixels PXp1 may be less than the size of the second pixel PX2. The light emission area of each of the plurality of first partial pixels PXp1 may be less than the light emission area of the second pixel PX2. For example, the sum of the light emission areas of the plurality of first partial pixels PXp1 included in the first pixel PX1 may be substantially equal to the light emission area of the second pixel PX2.

According to some embodiments, the sum of the amounts of light emitted by the plurality of first partial pixels PXp1 included in the first pixel PX1 when a signal corresponding to a particular gray scale value is input to the first pixel PX1 may be substantially equal to the sum of the amounts of light emitted by the second pixel PX2 when a signal corresponding to the particular gray scale value is input to the second pixel PX2.

According to some embodiments, depending on the operation mode of the display apparatus 1, both of the first pixel PX1 and the second pixel PX2 may be driven or only one of the first pixel PX1 and the second pixel PX2 may be driven. For example, the user may select an operation mode of the display apparatus 1, and depending on the operation mode, an image may be displayed through the first pixel PX1 and the second pixel PX2 or an image may be displayed only through the first pixel PX1. This will be described below with reference to FIG. 2.

In the plan view (e.g., a view perpendicular or normal with respect to a plane of the display surface of the display area DA), the display area DA may have a rectangular shape as in FIG. 1. According to some embodiments, the display area DA may have a polygonal shape such as a triangular, pentagonal, or hexagonal shape, a circular shape, an elliptical shape, an atypical shape, or the like.

The peripheral area PA of the substrate 100 may be an area located around the display area DA and may be an area where images are not displayed. In the peripheral area PA, various lines for transmitting an electrical signal to be applied to the display area DA, and pads to which a printed circuit board or a driver IC chip is attached may be located.

As illustrated in FIG. 1, a controller 30 may be arranged in the peripheral area PA. The controller 30 may control an overall operation of the display apparatus 1. The controller 30 may selectively operate at least one of the first pixel PX1 or the second pixel PX2 according to the operation mode of the display apparatus 1. This will be described in more detail below with reference to FIG. 2.

Figure 2:
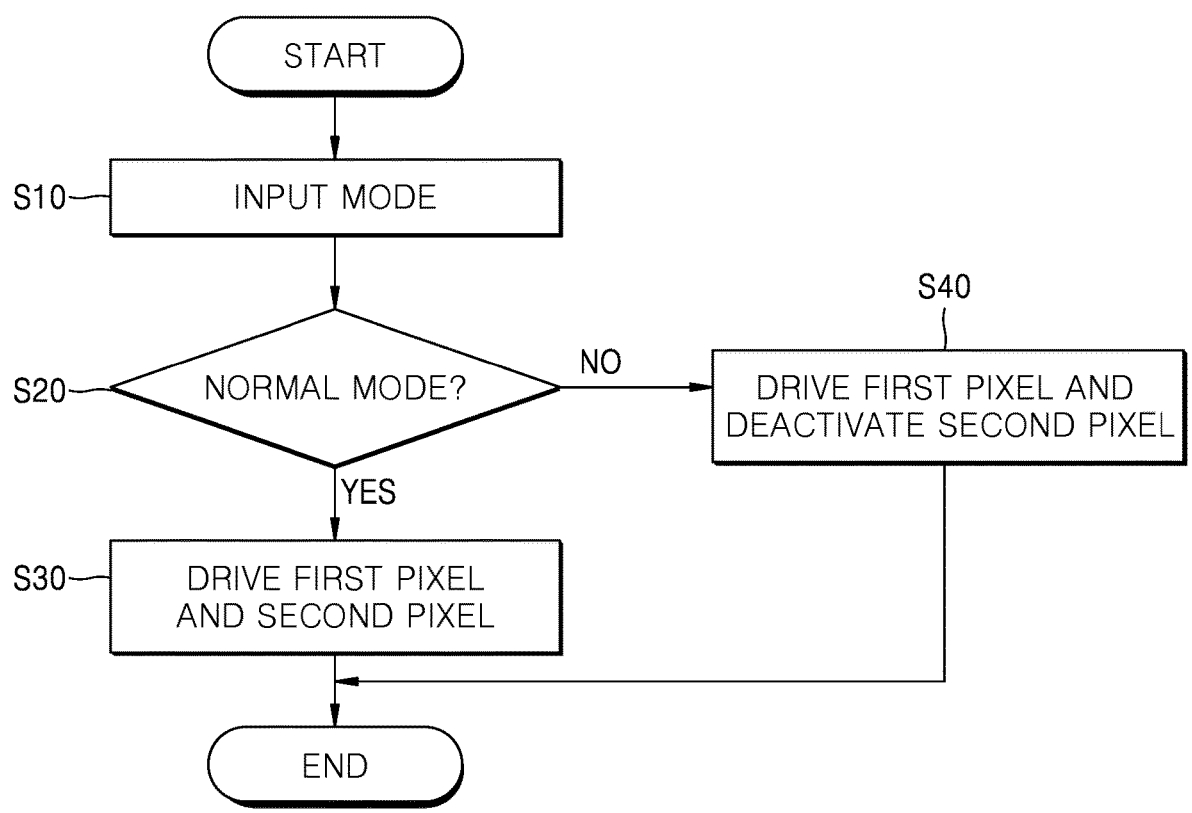
FIG. 2 is a conceptual diagram schematically illustrating driving of a display apparatus according to an embodiment.

FIG. 2 is a conceptual diagram schematically illustrating driving of a display apparatus according to some embodiments.

Referring to FIG. 2, the controller 30 may receive an input of a signal for selecting the operation mode (operation S10). The signal may be generated from a user's input (e.g., a touch input). As another example, the signal may be generated by an application executed by a user's input.

Thereafter, the controller 30 may drive both the first pixel PX1 and the second pixel PX2 when the operation mode is a first mode (operations S20 and S30) and may drive the first pixel PX1 and deactivate the second pixel PX2 when the operation mode is a second mode (operations S20 and S40).

According to some embodiments, the first mode may correspond to a normal mode, and the second mode may correspond to a secret mode. When the display apparatus 1 operates in the normal mode, the user may view an image displayed on the display apparatus 1 in the side direction as well as the front direction of the display apparatus 1. Accordingly, the images displayed by the display apparatus 1 operating in the normal mode may also be viewed by the third party other than the user. On the other hand, when the display apparatus 1 operates in the secret mode, the use may view an image displayed on the display apparatus 1 when the user is located in the front direction of the display apparatus 1. That is, because the image is displayed only by the first pixel PX1 having a narrow viewing angle, the third party located in the side direction of the display apparatus 1 may not see the image displayed on the display apparatus 1.

As such, a light blocking layer for narrowing the viewing angle may be arranged on the first pixel PX1 such that the image displayed on the display apparatus 1 may be viewed only from the front thereof in the secret mode. This will be described below with reference to FIGS. 5 and 6.

Moreover, as described above, the signal for selecting the operation mode may be generated by a user's input or may be generated by an application executed by the user. For example, when a security-critical application (e.g., a finance-related app) is executed, the application may output a signal for selecting the operation mode of the display apparatus 1 as the secret mode.

Figure 3A:
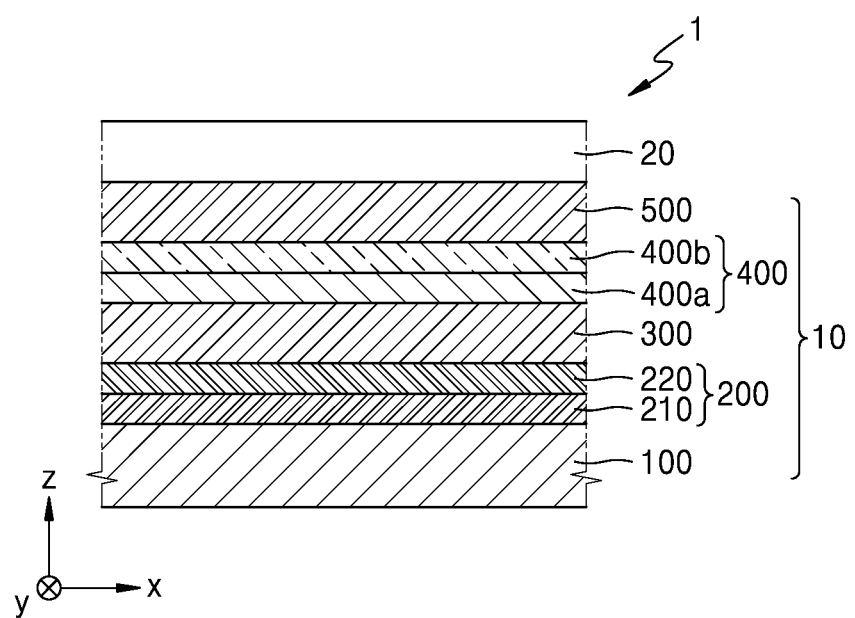
FIG. 3A is a cross-sectional view schematically illustrating a display apparatus according to some embodiments.
Figure 3B:
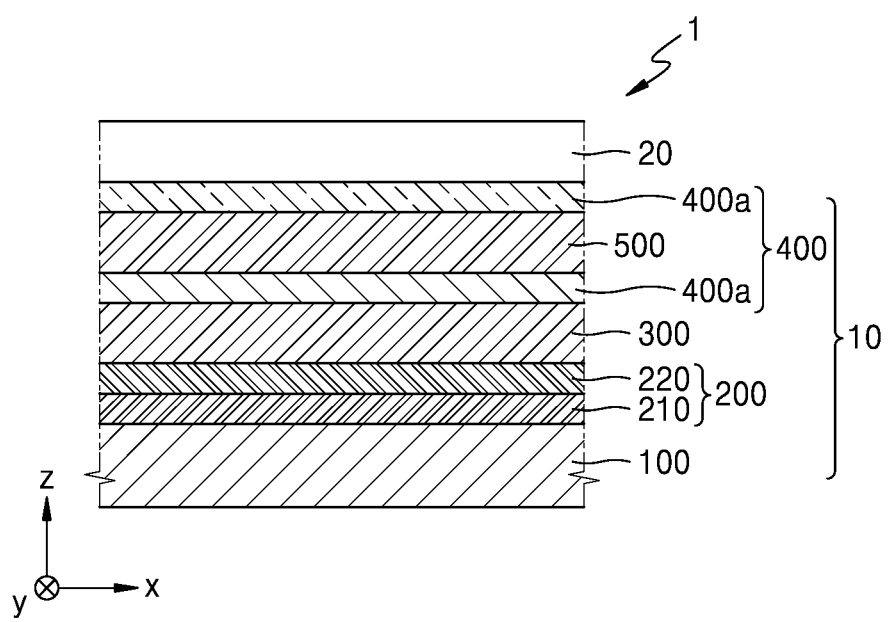
FIG. 3B is a cross-sectional view schematically illustrating a display apparatus according to some embodiments.

FIG. 3A is a cross-sectional view schematically illustrating a display apparatus according to some embodiments, and FIG. 3B is a cross-sectional view schematically illustrating a display apparatus according to other embodiments.

Referring to FIG. 3A, the display apparatus 1 may include a display panel 10 and a cover window 20. The display panel 10 may include a substrate 100, a display layer 200, an encapsulation layer 300, a functional layer 400, and an anti-reflection layer 500.

The substrate 100 may include glass or polymer resin such as polyethersulfone, polyarylate, polyetherimide, polyethylene naphthalate, polyethylene terephthalate, polyphenylene sulfide, polyimide, polycarbonate, cellulose triacetate, or cellulose acetate propionate. According to some embodiments, the substrate 100 may have a multilayer structure including a base layer and a barrier layer including the above polymer resin. The substrate 100 including the polymer resin may be flexible, rollable, or bendable.

The display layer 200 may be arranged on the substrate 100. The display layer 200 may include a pixel circuit layer 210 and a display element layer 220. The pixel circuit layer 210 may include a plurality of pixel circuits. The pixel circuit layer 210 may include a plurality of thin film transistors and a plurality of storage capacitors, and the display element layer 220 may include a plurality of display elements respectively connected to the plurality of pixel circuits.

The encapsulation layer 300 may be arranged on the display layer 200. According to some embodiments, the encapsulation layer 300 may include at least one inorganic encapsulation layer and at least one organic encapsulation layer. The at least one inorganic encapsulation layer may include one or more inorganic materials among aluminum oxide ($Al_2O_3$), titanium oxide ($TiO_2$), tantalum oxide ($Ta_2O_5$), zinc oxide (ZnO), silicon oxide ($SiO_2$), silicon nitride ($SiN_x$), and silicon oxynitride (SiON). The at least one organic encapsulation layer may include a polymer-based material. The polymer-based material may include acryl-based resin, epoxy-based resin, polyimide, polyethylene, or the like. According to some embodiments, the at least one organic encapsulation layer may include acrylate.

According to some embodiments, the encapsulation layer 300 may have a structure in which the substrate 100 and an upper substrate, which is a transparent member, are coupled by a sealing member to seal an internal space between the substrate 100 and the upper substrate. In this case, a moisture absorbent (desiccant) or a filler may be located in the internal space. The sealing member may include a sealant, and according to some embodiments, the sealing member may include a material that is cured by laser. For example, the sealing member may include frit. Particularly, the sealing member may include urethane-based resin, epoxy-based resin, acryl-based resin, or silicone that is inorganic sealant. For example, urethane acrylate or the like may be used as the urethane-based resin. For example, butyl acrylate, ethylhexyl acrylate, or the like may be used as the acryl-based resin. Moreover, the sealing member may include a material that is cured by heat.

The functional layer 400 may be arranged on the encapsulation layer 300. The functional layer 400 may include a first layer 400a and a second layer 400b. According to some embodiments, at least one of the first layer 400a or the second layer 400b may include a touch sensor layer. The touch sensor layer may be a layer for sensing a user's touch input and may sense a user's touch input by using at least one of various touch methods such as a resistive film method and a capacitive method. According to some embodiments, at least one of the first layer 400a or the second layer 400b may include an optical layer. The optical layer may be a layer having a structure for adjusting the direction of light emitted from the display elements. According to some embodiments, the optical layer may include a light blocking layer.

According to some embodiments, the functional layer 400 may be provided such that some components of the touch sensor layer and some components of the optical layer may be shared with each other. That is, the functional layer 400 may be a touch sensor layer capable of sensing a touch input and an optical layer capable of improving optical performance. The functional layer 400 may include sensing electrodes for sensing a touch input and may include a light blocking layer for adjusting the direction of light emitted from the display elements.

The anti-reflection layer 500 may be arranged on the functional layer 400. The anti-reflection layer 500 may be configured to reduce the reflectance of light (external light) incident from the outside toward the display panel 10.

According to some embodiments, the anti-reflection layer 500 may include a polarization film. The polarization film may include a linear polarization plate and a phase delay film such as a λ/4 plate (quarter-wave plate). The phase delay film may be arranged on the functional layer 400, and the linear polarization plate may be arranged on the phase delay film.

According to some embodiments, the anti-reflection layer 500 may include a filter layer including a black matrix and color filters. The color filters may be arranged considering the color of light emitted from each of the pixels of the display panel 10. For example, the filter layer may include red, green, or blue color filters.

According to some embodiments, when the anti-reflection layer 500 includes a black matrix and color filters, the anti-reflection layer 500 may be located between the first layer 400a and the second layer 400b as illustrated in FIG. 3B. In this case, the configuration of the anti-reflection layer 500 and the configuration of the optical layer may be at least partially shared with each other.

The cover window 20 may be arranged on the display panel 10. According to some embodiments, through an adhesive such as an optically clear adhesive (OCA), the cover window 20 may be coupled to a component thereunder, for example, at least one of the anti-reflection layer 500 or the functional layer 400. The cover window 20 may protect the display panel 10. The cover window 20 may include at least one of glass, sapphire, or plastic. The cover window 20 may include, for example, ultra-thin glass (UTG) or colorless polyimide (CPI).

Figure 4:
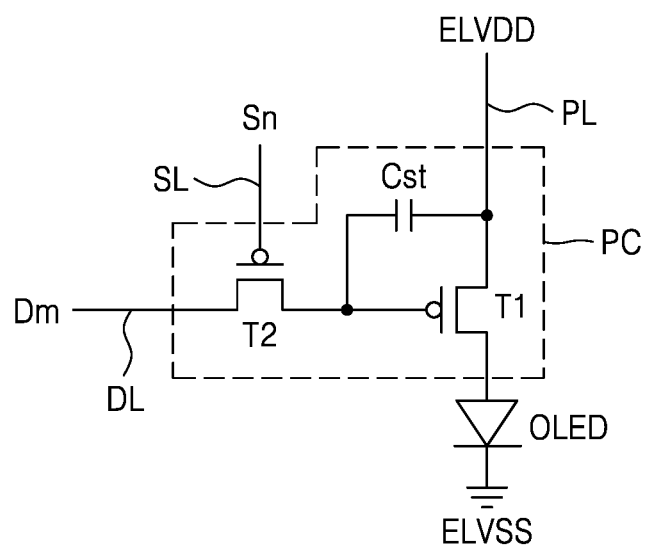
FIG. 4 is an equivalent circuit diagram schematically illustrating a pixel circuit applicable to a display apparatus according to some embodiments.

FIG. 4 is an equivalent circuit diagram schematically illustrating a pixel circuit applicable to a display apparatus according to some embodiments.

Referring to FIG. 4, a pixel circuit PC may be connected to a scan line SL, a data line DL, and a display element. The display element may include an organic light emitting diode OLED.

The pixel circuit PC may include a driving transistor T1, a scan transistor T2, and a storage capacitor Cst. The driving transistor T1 and the scan transistor T2 may include thin film transistors.

The scan transistor T2 may be connected to the scan line SL and the data line DL and may be configured to transmit a data voltage Dm input through the data line DL to the driving transistor T1 in synchronization with a scan signal Sn input through the scan line SL.

The storage capacitor Cst may be connected to the scan transistor T2 and a driving voltage line PL and may store a voltage corresponding to the difference between the data voltage Dm received from the scan transistor T2 and a driving voltage ELVDD applied to the driving voltage line PL.

The driving transistor T1 may be connected to the driving voltage line PL and the storage capacitor Cst and may control the level of a driving current flowing from the driving voltage line PL through the organic light emitting diode OLED in response to a voltage value stored in the storage capacitor Cst. The organic light emitting diode OLED may emit light with a brightness corresponding to the level of the driving current by the driving current.

Although FIG. 4 illustrates an example in which the pixel circuit PC includes two transistors and one storage capacitor, embodiments according to the present disclosure are not limited thereto. For example, the pixel circuit PC may include three or more transistors and/or two or more storage capacitors. According to some embodiments, the pixel circuit PC may include seven transistors and one storage capacitor.

The pixel circuit PC may refer to a circuit that drives the organic light emitting diode OLED according to the scan signal Sn and the data voltage Dm. Herein, the first pixel PX1 and the second pixel PX2 may correspond to an element driven by the pixel circuit PC, that is, the organic light emitting diode OLED. Depending on the context, the first pixel PX1 and the second pixel PX2 may refer to an element or an area that emits light by the pixel circuit PC. It may be understood that the pixel circuit PC drives each of the first pixel PX1 and the second pixel PX2.

Figure 5:
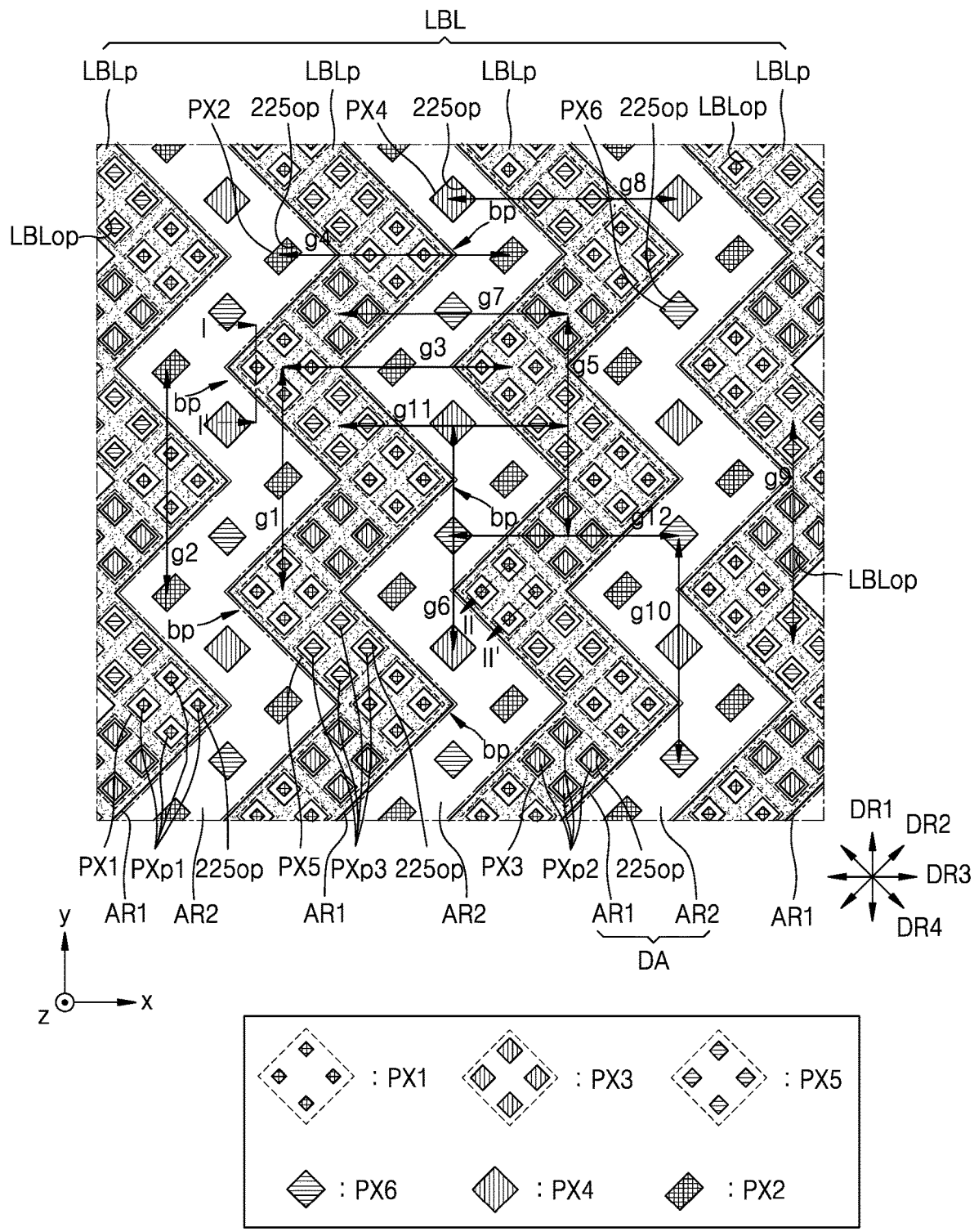
FIG. 5 is an enlarged plan view schematically illustrating the display apparatus of FIG. 1.

FIG. 5 is an enlarged plan view schematically illustrating the display apparatus of FIG. 1. Particularly, FIG. 5 is an enlarged plan view schematically illustrating a display area of the display apparatus of FIG. 1.

Referring to FIG. 5, the display apparatus 1 (see FIG. 1) may include a display area DA, and the display area DA may include a plurality of first areas AR1 and a plurality of second areas AR2. However, because the display apparatus 1 includes a substrate 100, it may be said that the substrate 100 includes the plurality of first areas AR1 and the plurality of second areas AR2.

Each of the plurality of first areas AR1 and the plurality of second areas AR2 may substantially extend in a first direction (e.g., ±y direction) DR1. Also, as illustrated in FIG. 5, each of the plurality of first areas AR1 and the plurality of second areas AR2 may have a shape bent at least one or more times. Each of the plurality of first areas AR1 and the plurality of second areas AR2 may have a zigzag shape.

According to some embodiments, the plurality of first areas AR1 and the plurality of second areas AR2 may be alternately arranged in a second direction (e.g., ±x direction) DR2 intersecting with the first direction DR1.

A plurality of first pixels PX1, a plurality of third pixels PX3, and a plurality of fifth pixels PX5 may be arranged in each of the plurality of first areas AR1, and a plurality of second pixels PX2, a plurality of fourth pixels PX4, and a plurality of sixth pixels PX6 may be arranged in each of the plurality of second areas AR2. Herein, each of the plurality of first pixels PX1 may be a minimum unit for implementing an image and may correspond to an emission area that emits light by a display element. Moreover, when an organic light emitting diode is used as the display element, the emission area may be defined by an opening of a pixel definition layer. Although the description has been given of the plurality of first pixels PX1, the plurality of second pixels PX2, the plurality of third pixels PX3, and the like may also be similarly applied. This will be described below with reference to FIG. 6.

The plurality of first pixels PX1 and the plurality of second pixels PX2 may be respectively arranged in the first direction DR1 and the second direction DR2 and may emit light of a first color. The plurality of first pixels PX1 and the plurality of second pixels PX2 may be respectively alternately arranged in the first direction DR1 and the second direction DR2.

Each of the plurality of first pixels PX1 may be arranged between two second pixels PX2 adjacent in the first direction DR1 among the plurality of second pixels PX2. Also, each of the plurality of first pixels PX1 may be arranged between two second pixels PX2 adjacent in the second direction DR2 among the plurality of second pixels PX2.

As for the plurality of second pixels PX2, each of the plurality of second pixels PX2 may be arranged between two first pixels PX1 adjacent in the first direction DR1 among the plurality of first pixels PX1. Also, each of the plurality of second pixels PX2 may be arranged between two first pixels PX1 adjacent in the second direction DR2 among the plurality of first pixels PX1.

According to some embodiments, as illustrated in FIG. 5, a first gap g1 of the plurality of first pixels PX1 in the first direction DR1 may be substantially equal to a second gap g2 of the plurality of second pixels PX2 in the first direction DR1. When the plurality of first pixels PX1 and the plurality of second pixels PX2 are alternately arranged, the brightness of light of the first color emitted from the plurality of first pixels PX1 and the plurality of second pixels PX2 may not be concentrated on a particular portion and may be generally uniform. Thus, a color shift phenomenon may be improved through the generally uniform light brightness.

According to some embodiments, as illustrated in FIG. 5, a third gap g3 of the plurality of first pixels PX1 in the second direction DR2 may be substantially equal to a fourth gap g4 of the plurality of second pixels PX2 in the second direction DR2. In this case, as described above, the brightness of light emitted from the plurality of first pixels PX1 and the plurality of second pixels PX2 may be generally uniform, and a color shift phenomenon may be improved.

Each of the plurality of first pixels PX1 may include a plurality of first partial pixels PXp1. Although FIG. 5 illustrates that one first pixel PX1 among the plurality of first pixels PX1 includes four first partial pixels PXp1, this is merely an example and the number of first partial pixels PXp1 included in the first pixel PX1 may vary according to embodiments. This will be described in more detail below with reference to FIGS. 9A and 9D.

According to some embodiments, the size of each of the plurality of first partial pixels PXp1 may be less than the size of each of the plurality of second pixels PX2. The light emission area of each of the plurality of first partial pixels PXp1 may be less than the light emission area of each of the plurality of second pixels PX2. For example, the sum of the light emission areas of the plurality of first partial pixels PXp1 included in one of the plurality of first pixels PX1 may be substantially equal to the light emission area of one of the plurality of second pixels PX2. As another example, the sum of the light emission areas of the plurality of first partial pixels PXp1 included in one of the plurality of first pixels PX1 may be different from the light emission area of one of the plurality of second pixels PX2.

According to some embodiments, the sum of amounts of light of the first color emitted, when a signal corresponding to a first gray scale value is input to one first pixel PX1 among the plurality of first pixels PX1, by the plurality of first partial pixels PXp1 included in the one first pixel PX1 may be substantially equal to the sum of amounts of light of the first color emitted, when a signal corresponding to the first gray scale value is input to one second pixel PX2 among the plurality of second pixels PX2, by the one second pixel PX2.

The plurality of third pixels PX3 and the plurality of fourth pixels PX4 may be respectively arranged in the first direction DR1 and the second direction DR2 and may emit light of a second color.

Each of the plurality of third pixels PX3 and the plurality of fourth pixels PX4 may be arranged between two first pixels PX1 adjacent in a third direction DR3 among the plurality of first pixels PX1. Also, the plurality of third pixels PX3 and the plurality of fourth pixels PX4 may be alternately arranged in the third direction DR3. Here, the third direction DR3 may intersect with each of the first direction DR1 and the second direction DR2.

According to some embodiments, as illustrated in FIG. 5, a fifth gap g5 of the plurality of third pixels PX3 in the first direction DR1 may be substantially equal to a sixth gap g6 of the plurality of fourth pixels PX4 in the first direction DR1. When the plurality of third pixels PX3 and the plurality of fourth pixels PX4 are alternately arranged, the brightness of light of the second color emitted from the plurality of third pixels PX3 and the plurality of fourth pixels PX4 may not be concentrated on a particular portion and may be generally uniform. Thus, a color shift phenomenon may be improved through the generally uniform light brightness.

According to some embodiments, as illustrated in FIG. 5, a seventh gap g7 of the plurality of third pixels PX3 in the second direction DR2 may be substantially equal to an eighth gap g8 of the plurality of fourth pixels PX4 in the second direction DR2. In this case, as described above, the brightness of light emitted from the plurality of third pixels PX3 and the plurality of fourth pixels PX4 may be generally uniform, and a color shift phenomenon may be improved.

Each of the plurality of third pixels PX3 may include a plurality of second partial pixels PXp2. Although FIG. 5 illustrates that one third pixel PX3 among the plurality of third pixels PX3 includes four second partial pixels PXp2, this is merely an example and the number of second partial pixels PXp2 included in the third pixel PX3 may vary according to embodiments.

According to some embodiments, the size of each of the plurality of second partial pixels PXp2 may be less than the size of each of the plurality of fourth pixels PX4. The light emission area of each of the plurality of second partial pixels PXp2 may be less than the light emission area of each of the plurality of fourth pixels PX4. For example, the sum of the light emission areas of the plurality of second partial pixels PXp2 included in one of the plurality of third pixels PX3 may be substantially equal to the light emission area of one of the plurality of fourth pixels PX4. As another example, the sum of the light emission areas of the plurality of second partial pixels PXp2 included in one of the plurality of third pixels PX3 may be different from the light emission area of one of the plurality of fourth pixels PX4.

According to some embodiments, the sum of amounts of light of the second color emitted, when a signal corresponding to a second gray scale value is input to one third pixel PX3 among the plurality of third pixels PX3, by the plurality of second partial pixels PXp2 included in the one third pixel PX3 may be substantially equal to the sum of amounts of light of the second color emitted, when a signal corresponding to the second gray scale value is input to one fourth pixel PX4 among the plurality of fourth pixels PX4, by the one fourth pixel PX4.

The plurality of fifth pixels PX5 and the plurality of sixth pixels PX6 may be respectively arranged in the first direction DR1 and the second direction DR2 and may emit light of a third color.

Each of the plurality of fifth pixels PX5 and the plurality of sixth pixels PX6 may be arranged between two first pixels PX1 adjacent in a fourth direction DR4 among the plurality of first pixels PX1. Also, the plurality of fifth pixels PX5 and the plurality of sixth pixels PX6 may be alternately arranged in the fourth direction DR4. Here, the fourth direction DR4 may intersect with each of the first direction DR1 and the second direction DR2.

According to some embodiments, as illustrated in FIG. 5, a ninth gap g9 of the plurality of fifth pixels PX5 in the first direction DR1 may be substantially equal to a tenth gap g10 of the plurality of sixth pixels PX6 in the first direction DR1. When the plurality of fifth pixels PX5 and the plurality of sixth pixels PX6 are alternately arranged, the brightness of light of the third color emitted from the plurality of fifth pixels PX5 and the plurality of sixth pixels PX6 may not be concentrated on a particular portion and may be generally uniform. Thus, a color shift phenomenon may be improved through the generally uniform light brightness.

According to some embodiments, as illustrated in FIG. 5, an eleventh gap g11 of the plurality of fifth pixels PX5 in the second direction DR2 may be substantially equal to a twelfth gap g12 of the plurality of sixth pixels PX5 in the second direction DR2. In this case, as described above, the brightness of light emitted from the plurality of fifth pixels PX5 and the plurality of sixth pixels PX6 may be generally uniform, and a color shift phenomenon may be improved.

Each of the plurality of fifth pixels PX5 may include a plurality of third partial pixels PXp3. Although FIG. 5 illustrates that one fifth pixel PX5 among the plurality of fifth pixels PX5 includes four third partial pixels PXp3, this is merely an example and the number of third partial pixels PXp3 included in the fifth pixel PX5 may vary according to embodiments.

According to some embodiments, the size of each of the plurality of third partial pixels PXp3 may be less than the size of each of the plurality of sixth pixels PX6. The light emission area of each of the plurality of third partial pixels PXp3 may be less than the light emission area of each of the plurality of sixth pixels PX6. For example, the sum of the light emission areas of the plurality of third partial pixels PXp3 included in one of the plurality of fifth pixels PX5 may be substantially equal to the light emission area of one of the plurality of sixth pixels PX6. As another example, the sum of the light emission areas of the plurality of third partial pixels PXp3 included in one fifth pixel PX5 among the plurality of fifth pixels PX5 may be different from the light emission area of one sixth pixel PX6 among the plurality of sixth pixels PX6.

According to some embodiments, the sum of amounts of light of the third color emitted, when a signal corresponding to a third gray scale value is input to one fifth pixel PX5 among the plurality of fifth pixels PX5, by the plurality of third partial pixels PXp3 included in the one fifth pixel PX5 may be substantially equal to the sum of amounts of light of the third color emitted, when a signal corresponding to the third gray scale value is input to one sixth pixel PX6 among the plurality of sixth pixels PX6, by the one sixth pixel PX6.

According to some embodiments, as illustrated in FIG. 5, the plurality of third pixels PX3 and the plurality of fifth pixels PX5 may be alternately arranged in the first direction DR1, and the plurality of fourth pixels PX4 and the plurality of sixth pixels PX6 may be alternately arranged in the first direction DR1. Also, the plurality of third pixels PX3 and the plurality of sixth pixels PX6 may be alternately arranged in the second direction DR2, and the plurality of fourth pixels PX4 and the plurality of fifth pixels PX5 may be alternately arranged in the second direction DR2.

According to some embodiments, the first color, the second color, and the third color may be respectively green, blue, and red colors. This is merely an example, and the first color, the second color, and the third color may vary according to embodiments.

As described above with reference to FIG. 4, the display apparatus 1 may include a pixel circuit PC that drives a pixel. That is, the display apparatus 1 may include a plurality of first pixel circuits respectively driving the plurality of first pixels PX1, and a plurality of second pixel circuits respectively driving the plurality of second pixels PX2. In this case, each of the plurality of first pixel circuits and the plurality of second pixel circuits may include a driving transistor T1 substantially having the same channel characteristics. Substantially having the same channel characteristics may mean that the channel lengths and widths or the threshold voltages thereof are substantially equal to each other. The plurality of first pixel circuits and the plurality of second pixel circuits may substantially have the same circuit configuration.

According to some embodiments, each of the plurality of first pixel circuits may commonly drive a plurality of first partial pixels PXp1 included in a corresponding first pixel PX1 among the plurality of first pixels PX1. This will be described below with reference to FIG. 8.

Although the description has been given of the plurality of first pixels PX1 and the plurality of second pixels PX2, the plurality of third pixels PX3, the plurality of fourth pixels PX4, and the plurality of fifth pixels PX5, and the plurality of sixth pixels PX6 may also be similarly applied.

That is, the display apparatus 1 may include a plurality of third pixel circuits respectively driving the plurality of third pixels PX3, and a plurality of fourth pixel circuits respectively driving the plurality of fourth pixels PX4. In this case, each of the plurality of third pixel circuits and the plurality of fourth pixel circuits may include a driving transistor T1 substantially having the same channel characteristics. The plurality of third pixel circuits and the plurality of fourth pixel circuits may substantially have the same circuit configuration. According to some embodiments, each of the plurality of third pixel circuits may commonly drive a plurality of second partial pixels PXp2 included in a corresponding third pixel PX3 among the plurality of third pixels PX3.

Also, the display apparatus 1 may include a plurality of fifth pixel circuits respectively driving the plurality of fifth pixels PX5, and a plurality of sixth pixel circuits respectively driving the plurality of sixth pixels PX6. In this case, each of the plurality of fifth pixel circuits and the plurality of sixth pixel circuits may include a driving transistor T1 substantially having the same channel characteristics. The plurality of fifth pixel circuits and the plurality of sixth pixel circuits may substantially have the same circuit configuration. According to some embodiments, each of the plurality of fifth pixel circuits may commonly drive a plurality of third partial pixels PXp3 included in a corresponding fifth pixel PX5 among the plurality of fifth pixels PX5.

Moreover, referring to FIG. 5, the display apparatus 1 may include a light blocking layer LBL arranged on the first area AR1. The light blocking layer LBL may not overlap the second area AR2. As described above, a plurality of first pixels PX1, a plurality of third pixels PX3, and a plurality of fifth pixels PX5 may be arranged in the first area AR1, and a plurality of second pixels PX2, a plurality of fourth pixels PX4, and a plurality of sixth pixels PX6 may be arranged in the second area AR2.

The light blocking layer LBL may include a plurality of light blocking patterns LBLp substantially extending in the first direction DR1. Because the plurality of light blocking patterns LBLp are arranged on the first area AR1 and do not overlap the second area AR2, the plurality of light blocking patterns LBLp may be spaced apart from each other in the second direction DR2. The second area AR2 may be located between two light blocking patterns LBLp adjacent in the second direction DR2 among the plurality of light blocking patterns LBLp. An area in which the plurality of light blocking patterns LBLp are spaced apart from each other may overlap the second area AR2.

According to some embodiments, each of the plurality of light blocking patterns LBLp may be bent at least one or more times. Each of the plurality of light blocking patterns LBLp may have a shape bent at least one or more times. Each of the plurality of light blocking patterns LBLp may have a zigzag shape.

According to some embodiments, a plurality of first pixels PX1 may be arranged to respectively correspond to bent portions bp of each of the plurality of light blocking patterns LBLp. Although FIG. 5 illustrates that the plurality of first pixels PX1 are arranged to respectively correspond to the bent portions bp of each of the plurality of light blocking patterns LBLp, this is merely an example and various modifications may be made therein. For example, a plurality of third pixels PX3 or a plurality of fifth pixels PX5 may be arranged to respectively correspond to the bent portions bp of each of the plurality of light blocking patterns LBLp.

Figure 6:
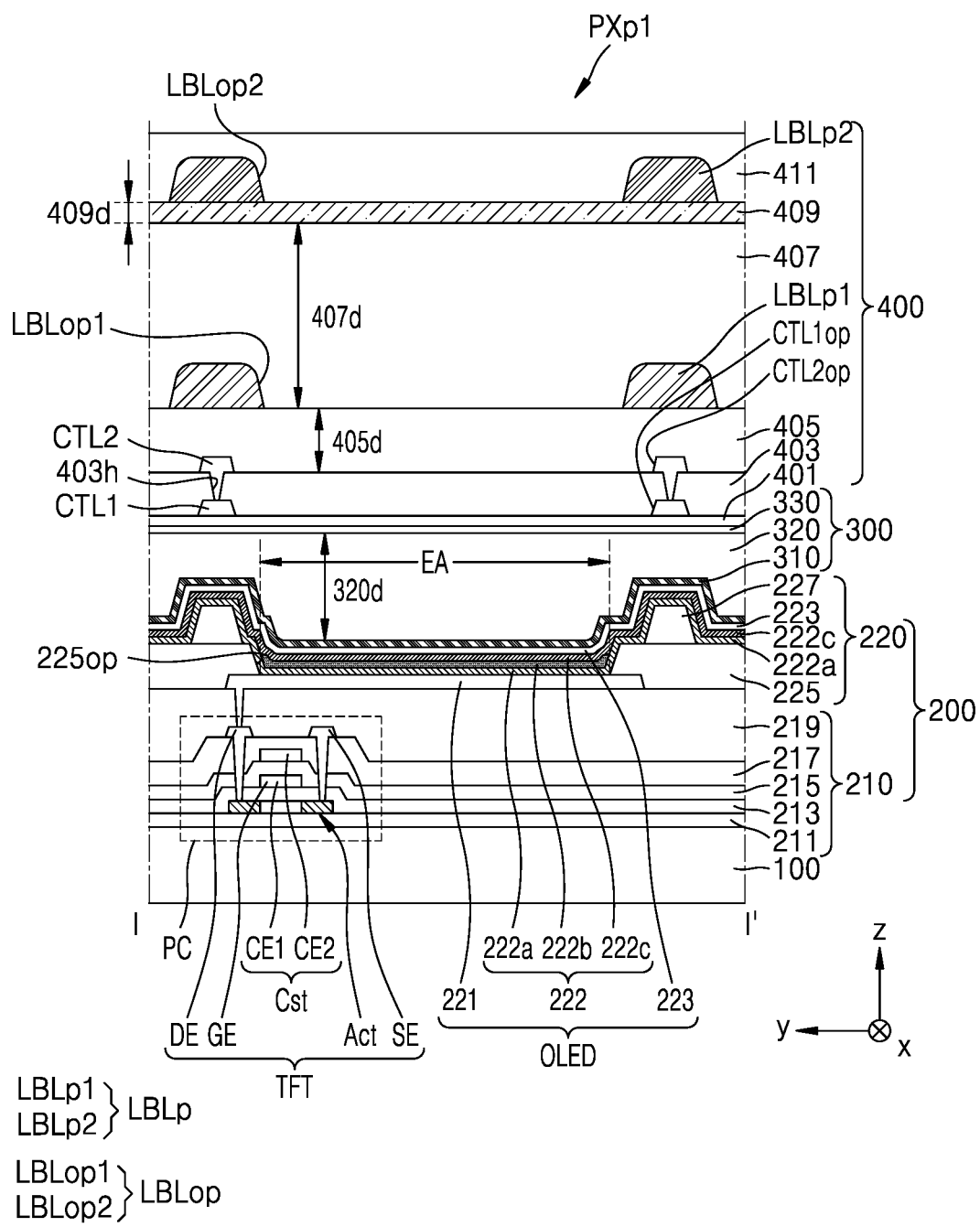
FIG. 6 is an example of a cross-sectional view of a first partial pixel taken along the line I-I' of FIG. 5.

According to some embodiments, each of the plurality of light blocking patterns LBLp may include a lower light blocking pattern LBLp1 (see FIG. 6) and an upper light blocking pattern LBLp2 (see FIG. 6). This will be described below with reference to FIG. 6.

Each of the plurality of light blocking patterns LBLp may include a plurality of opening portions LBLop respectively corresponding to the plurality of first partial pixels PXp1, the plurality of second partial pixels PXp2, and the plurality of third partial pixels PXp3.

Each of the plurality of light blocking patterns LBLp may block the light propagating in a direction inclined to the front of the substrate 100 and/or the display apparatus 1, among the light emitted from each of the plurality of first partial pixels PXp1, the plurality of second partial pixels PXp2, and the plurality of third partial pixels PXp3. Each of the plurality of light blocking patterns LBLp may at least partially absorb the light propagating in a direction inclined to the front of the substrate 100 and/or the display apparatus 1, among the light emitted from each of the plurality of first partial pixels PXp1, the plurality of second partial pixels PXp2, and the plurality of third partial pixels PXp3. This will be described below in more detail with reference to FIG. 7.

On the other hand, the light propagating in the front direction of the substrate 100 and/or the display apparatus 1, among the light emitted from each of the plurality of first partial pixels PXp1, the plurality of second partial pixels PXp2, and the plurality of third partial pixels PXp3 may continue to propagate through the plurality of opening portions LBLop without being blocked.

As such, the light emitted from each of the plurality of first partial pixels PXp1, the plurality of second partial pixels PXp2, and the plurality of third partial pixels PXp3 may propagate in the front direction of the substrate 100 and/or the display apparatus 1 through the plurality of light blocking patterns LBLp.

Unlike this, the plurality of second pixels PX2, the plurality of fourth pixels PX4, and the plurality of sixth pixels PX6 may be arranged in the second area AR2 where the plurality of light blocking patterns LBLp are not arranged. The light emitted from each of the plurality of second pixels PX2, the plurality of fourth pixels PX4, and the plurality of sixth pixels PX6 may propagate in various directions without being at least partially absorbed by the plurality of light blocking patterns LBLp.

Moreover, as described above with reference to FIG. 2, the controller 30 may receive an input of a signal for selecting the operation mode (operation S10), drive both the first pixel PX1 and the second pixel PX2 when the operation mode is a first mode (operations S20 and S30), and drive the first pixel PX1 and deactivate the second pixel PX2 when the operation mode is a second mode (operations S20 and S40). Although the description has been given of the second pixel PX2, the third to sixth pixels PX3, PX4, PX5, and PX6 may also be similarly applied.

That is, the controller 30 may drive the first to sixth pixels PX1, PX2, PX3, PX4, PX5, and PX6 when the operation mode is the first mode and may drive the pixel PX1, the third pixel PX3, and the fifth pixel PX5 and deactivate the second pixel PX2, the fourth pixel PX4, and the sixth pixel PX6 when the operation mode is the second mode.

In the first mode, the first to sixth pixels PX1, PX2, PX3, PX4, PX5, and PX6 may be driven, and in this case, the screen of the display apparatus 1 may be displayed through the light emitted from each of the first to sixth pixels PX1, PX2, PX3, PX4, PX5, and PX6. As such, because the screen of the display apparatus 1 is displayed including the light emitted from each of the second pixel PX2, the fourth pixel PX4, and the sixth pixel PX6, it may be displayed through the light propagating in various directions, which is not at least partially absorbed by the light blocking pattern LBLp. Thus, the screen of the display apparatus 1 may be viewed from both the front and the side. That is, the screen of the display apparatus 1 may be viewed by the user and the third party other than the user. The first mode may correspond to a normal mode.

In the second mode, the first pixel PX1, the third pixel PX3, and the fifth pixel PX5 may be driven and the second pixel PX2, the fourth pixel PX4, and the sixth pixel PX6 may be deactivated, and in this case, the screen of the display apparatus 1 may be displayed through the light emitted from each of the first pixel PX1, the third pixel PX3, and the fifth pixel PX5. As described above, the light emitted from each of the first pixel PX1, the third pixel PX3, and the fifth pixel PX5 may propagate in the front direction of the substrate 100 and/or the display apparatus 1 by the light blocking pattern LBLp. As such, the screen of the display apparatus 1 may be displayed through the light propagating in the front direction of the substrate 100 and/or the display apparatus 1 by the light blocking pattern LBLp. Thus, the screen of the display apparatus 1 may be viewed only from the front. That is, the screen of the display apparatus 1 may be viewed by the user but may not be viewed by the third party other than the user. The second mode may correspond to a secret mode.

Figure 7:
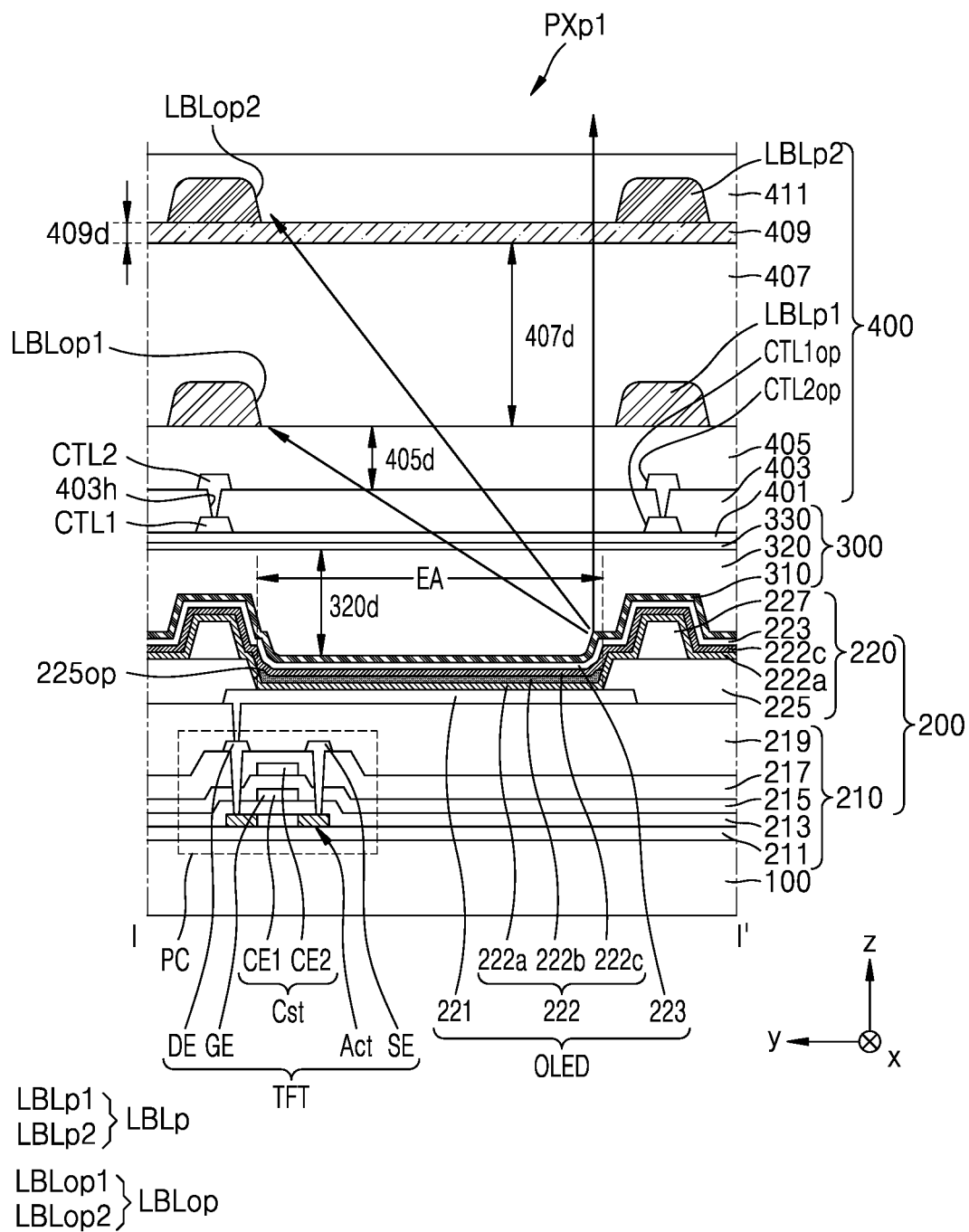
FIG. 7 schematically illustrates a path of light emitted from an organic light emitting diode of FIG. 6.

FIG. 6 is an example of a cross-sectional view of a first partial pixel taken along the line I-I' of FIG. 5, and FIG. 7 schematically illustrates a path of light emitted from an organic light emitting diode of FIG. 6. In FIGS. 6 and 7, like reference numerals as those in FIGS. 3A, 3B, and 5 denote like members, and thus redundant descriptions thereof will be omitted for conciseness.

Referring to FIG. 6, the display panel 10 may include a substrate 100, a display layer 200, an encapsulation layer 300, and a functional layer 400. The display layer 200 may include a pixel circuit layer 210 and a display element layer 220.

The pixel circuit layer 210 may be arranged on the substrate 100. The pixel circuit layer 210 may include a buffer layer 211, a first gate insulating layer 213, a second gate insulating layer 215, an interlayer insulating layer 217, an organic insulating layer 219, and a pixel circuit PC. The pixel circuit PC may include a thin film transistor TFT and a storage capacitor Cst.

The buffer layer 211 may be arranged on the substrate 100. The buffer layer 211 may include an inorganic insulating material such as silicon nitride ($SiN_x$), silicon oxynitride (SiON), and silicon oxide ($SiO_2$) and may be a single layer or multiple layers including the inorganic insulating material.

The thin film transistor TFT may include a semiconductor layer Act, and the semiconductor layer Act may be arranged on the buffer layer 211. The semiconductor layer Act may include polysilicon. Alternatively, the semiconductor layer Act may include amorphous silicon, may include an oxide semiconductor, or may include an organic semiconductor or the like. The semiconductor layer Act may include a channel area, and a drain area and a source area respectively arranged on both sides of the channel area.

A gate electrode GE may overlap the channel area. The gate electrode GE may include a low-resistance metal material. The gate electrode GE may include a conductive material including molybdenum (Mo), aluminum (Al), copper (Cu), titanium (Ti), or the like and may include a single layer or multiple layers including the above material.

The first gate insulating layer 213 between the semiconductor layer Act and the gate electrode GE may include an inorganic insulating material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide (ZnO).

The second gate insulating layer 215 may be provided to cover the gate electrode GE. Like the first gate insulating layer 213, the second gate insulating layer 215 may include an inorganic insulating material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide (ZnO).

An upper electrode CE2 of the storage capacitor Cst may be arranged on the second gate insulating layer 215. The upper electrode CE2 may overlap the gate electrode GE thereunder. In this case, the gate electrode GE and the upper electrode CE2 overlapping each other with the second gate insulating layer 215 therebetween may form the storage capacitor Cst. That is, the gate electrode GE may function as a lower electrode CE1 of the storage capacitor Cst.

As such, the storage capacitor Cst and the thin film transistor TFT may be formed to overlap each other. In some embodiments, the storage capacitor Cst may be formed not to overlap the thin film transistor TFT.

The upper electrodes CE2 may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and/or copper (Cu) and may include a single layer or multiple layers of the above material.

The interlayer insulating layer 217 may cover the upper electrode CE2. The interlayer insulating layer 217 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide (ZnO). The interlayer insulating layer 217 may include a single layer or multiple layers including the above inorganic insulating material.

Each of a drain electrode DE and a source electrode SE may be located over the interlayer insulating layer 217. The drain electrode DE and the source electrode SE may include a material having high conductivity. The drain electrode DE and the source electrode SE may include a conductive material including molybdenum (Mo), aluminum (Al), copper (Cu), titanium (Ti), or the like and may include a single layer or multiple layers including the above material. According to some embodiments, the drain electrode DE, and the source electrode SE may have a multilayer structure of Ti/Al/Ti.

The organic insulating layer 219 may be arranged to cover the drain electrode DE and the source electrode SE. The organic insulating layer 219 may include an organic insulating material such as a general-purpose polymer such as polymethylmethacrylate (PMMA) or polystyrene (PS), a polymer derivative having a phenolic group, an acrylic polymer, an imide-based polymer, an arylether-based polymer, an amide-based polymer, a fluorine-based polymers, a p-xylene-based polymer, a vinyl alcohol-based polymer, or any blend thereof. In some embodiments, the organic insulating layer 219 may have a multilayer structure and may include a first organic insulating layer and a second organic insulating layer.

The display element layer 220 may be arranged on the pixel circuit layer 210. The display element layer 220 may be arranged on the organic insulating layer 219. The display element layer 220 may include an organic light emitting diode OLED as a display element, a pixel definition layer 225, and a spacer 227.

The organic light emitting diode OLED may be arranged on the organic insulating layer 219. The organic light emitting diode OLED may emit red, green, or blue light or may emit red, green, blue, or white light. The organic light emitting diode OLED may include a pixel electrode 221, an intermediate layer 222, and an opposite electrode 223.

The pixel electrode 221 may be directly arranged on the organic insulating layer 219. The pixel electrode 221 may be electrically connected to the source electrode SE or the drain electrode DE through a contact hole of the organic insulating layer 219. The pixel electrode 221 may include a conductive oxide such as indium tin oxide (ITO), indium zinc oxide (IZO), zinc oxide (ZnO), indium oxide ($In_2O_3$), indium gallium oxide (IGO), or aluminum zinc oxide (AZO). According to some embodiments, the pixel electrode 221 may include a reflection layer including silver (Ag), magnesium (Mg), aluminum (Al), platinum (Pt), palladium (Pd), gold (Au), nickel (Ni), neodymium (Nd), iridium (Ir), chromium (Cr), or any compound thereof. In other embodiments, the pixel electrode 221 may further include a layer formed of ITO, IZO, ZnO, or $In_2O_3$ over/under the reflection layer. For example, the pixel electrode 221 may have a multilayer structure of ITO/Ag/ITO.

The pixel definition layer 225 including an opening 225op exposing at least a portion of the pixel electrode 221 may be arranged on the pixel electrode 221. The pixel definition layer 225 may cover the edge of the pixel electrode 221. The pixel definition layer 225 may include an organic insulating material and/or an inorganic insulating material. The opening 225op may define an area of light emitted from the organic light emitting diode OLED (hereinafter referred to as an emission area EA). For example, the width of the opening 225op may correspond to the width of the emission area EA.

The pixel definition layer 225 may prevent or reduce the occurrence of an arc or the like at the edge of the pixel electrode 221 by increasing the distance between the edge of the pixel electrode 221 and the opposite electrode 223 over the pixel electrode 221.

The spacer 227 may be arranged on the pixel definition layer 225. The spacer 227 may include an organic insulating material such as polyimide. Alternatively, the spacer 227 may include an inorganic insulating material such as silicon nitride (SiNx) or silicon oxide (SiO2) or may include an organic insulating material and an inorganic insulating material.

According to some embodiments, the spacer 227 may include a different material than the pixel definition layer 225. In other embodiments, the spacer 227 may include the same material as the pixel definition layer 225, and in this case, the pixel definition layer 225 and the spacer 227 may be formed together in a mask process using a halftone mask or the like.

The intermediate layer 222 may be arranged on the pixel definition layer 225. The intermediate layer 222 may include an emission layer 222b arranged in the opening 225op of the pixel definition layer 225. The emission layer 222b may include a high-molecular or low-molecular weight organic material for emitting light of a certain color.

A first functional layer 222a and a second functional layer 222c may be respectively arranged under and over the emission layer 222b. The first functional layer 222a may include, for example, a hole transport layer (HTL) or may include an HTL and a hole injection layer (HIL). The second functional layer 222c may be a component arranged on the emission layer 222b and may be optional. The second functional layer 222c may include an electron transport layer (ETL) and/or an electron injection layer (EIL). Like the opposite electrode 223 described below, the first functional layer 222a and/or the second functional layer 222c may be a common layer formed to entirely cover the substrate 100.

The opposite electrode 223 may include a conductive material having a low work function. For example, the opposite electrode 223 may include a (semi)transparent layer including silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or any alloy thereof. Alternatively, the opposite electrode 223 may further include a layer such as ITO, IZO, ZnO, or $In_2O_3$ over the (semi)transparent layer including the above material.

According to some embodiments, a capping layer may be further arranged on the opposite electrode 223. The capping layer may include LiF, an inorganic material, and/or an organic material.

Although FIG. 6 illustrates a cross-section of the first partial pixel PXp1 of FIG. 5, a portion of the pixel circuit layer 210 and the display element layer 220 illustrated in FIG. 6 may correspond to a cross-section of each of the second pixel PX2, the fourth pixel PX4, and the sixth pixel PX6 of FIG. 5. As such, each of the second pixel PX2, the fourth pixel PX4, and the sixth pixel PX6 may be driven through the pixel circuit PC and may correspond to the emission area EA.

The encapsulation layer 300 may be arranged on the display layer 200. The encapsulation layer 300 may cover the organic light emitting diode OLED. According to some embodiments, the encapsulation layer 300 may include at least one inorganic encapsulation layer and at least one organic encapsulation layer. FIG. 6 illustrates that the encapsulation layer 300 includes a first inorganic encapsulation layer 310, an organic encapsulation layer 320, and a second inorganic encapsulation layer 330 that are sequentially stacked.

The first inorganic encapsulation layer 310 and the second inorganic encapsulation layer 330 may include one or more inorganic materials among aluminum oxide (Al2O3), titanium oxide (TiO2), tantalum oxide (Ta2O5), hafnium oxide (HfO2) zinc oxide (ZnO), silicon oxide (SiO2), silicon nitride (SiNx), and silicon oxynitride (SiON). The organic encapsulation layer 320 may include a polymer-based material. The polymer-based material may include acryl-based resin, epoxy-based resin, polyimide, polyethylene, or the like. According to some embodiments, the organic encapsulation layer 320 may include acrylate.

The functional layer 400 may be arranged on the encapsulation layer 300. The functional layer 400 may include a touch buffer layer 401, a first touch insulating layer 403, a second touch insulating layer 405, an organic layer 407, an inorganic layer 409, a planarization layer 411, a first touch conductive layer CTL1, a second touch conductive layer CTL2, and a light blocking pattern LBLp. The light blocking pattern LBLp may include a lower light blocking pattern LBLp1 and an upper light blocking pattern LBLp2. As described above with reference to FIG. 5, because the light blocking pattern LBLp may include a plurality of opening portions LBLop, the lower light blocking pattern LBLp1 may have a plurality of first opening portions LBLop1 and the upper light blocking pattern LBLp2 may include a plurality of second opening portions LBLop2.

The touch buffer layer 401 may be arranged on the encapsulation layer 300. According to some embodiments, the touch buffer layer 401 may be directly formed over the encapsulation layer 300. The touch buffer layer 401 may prevent or reduce damage to the encapsulation layer 300 and may block an interference signal that may occur when the functional layer 400 is driven as a touch sensor layer. The touch buffer layer 401 may include an inorganic insulating material such as silicon oxide (SiO2), silicon nitride (SiNx), and silicon oxynitride (SiON) and may include a single layer or multiple layers. According to some embodiments, the touch buffer layer 401 may be omitted.

The first touch conductive layer CTL1 may be arranged on the touch buffer layer 401. The first touch insulating layer 403 may cover the first touch conductive layer CTL1 and may include a contact hole 403h exposing at least a portion of the first touch conductive layer CTL1. The second touch conductive layer CTL2 may be arranged on the first touch insulating layer 403. The second touch conductive layer CTL2 may be electrically connected to the first touch conductive layer CTL1 through the contact hole 403h of the first touch insulating layer 403. A user's touch input may be sensed by using the first touch conductive layer CTL1 and the second touch conductive layer CTL2.

At least one of the first touch conductive layer CTL1 and the second touch conductive layer CTL2 may include an opening overlapping the emission area EA of the organic light emitting diode OLED. According to some embodiments, the first touch conductive layer CTL1 may include a first opening CTLop1 overlapping the emission area EA. According to some embodiments, the second touch conductive layer CTL2 may include a second opening CTLop2 overlapping the emission area EA.

The first touch insulating layer 403 may include an inorganic material or an organic material. The inorganic material may include at least one of silicon nitride, aluminum nitride, zirconium nitride, titanium nitride, hafnium nitride, tantalum nitride, silicon oxide, aluminum oxide, titanium oxide, tin oxide, cerium oxide, or silicon oxynitride. The organic material may include at least one of methacryl-based resin, acryl-based resin, polyisoprene, vinyl-based resin, epoxy-based resin, urethane-based resin, cellulose-based resin, or perylene-based resin.

At least one of the first touch conductive layer CTL1 and the second touch conductive layer CTL2 may include a metal layer or a transparent conductive layer, and the metal layer may include molybdenum (Mo), silver (Ag), titanium (Ti), copper (Cu), aluminum (Al), or any alloy thereof. The transparent conductive layer may include a transparent conductive oxide such as indium tin oxide (ITO), indium zinc oxide (IZO), zinc oxide (ZnO), or indium tin zinc oxide (ITZO). In addition, the transparent conductive layer may include a conductive polymer such as poly(3,4-ethylenedioxythiophene) (PEDOT), metal nanowire, graphene, or the like. According to some embodiments, each of the first touch conductive layer CTL1 and the second touch conductive layer CTL2 may have a three-layer structure of a titanium layer, an aluminum layer, and a titanium layer.

The second touch insulating layer 405 may be arranged on the first touch insulating layer 403. The second touch insulating layer 405 may cover the second touch conductive layer CTL2. The second touch insulating layer 405 may cover the first touch conductive layer CTL1 and the second touch conductive layer CTL2, and the second touch insulating layer 405 may protect the first touch conductive layer CTL1 and the second touch conductive layer CTL2.

According to some embodiments, the second touch insulating layer 405 may include a photoresist. In this case, the second touch insulating layer 405 may be formed by entirely applying a photoresist over the encapsulation layer 300 and then exposing and developing the same. According to some embodiments, the second touch insulating layer 405 may include a flat upper surface.

Although FIG. 6 illustrates that the second touch insulating layer 405 is arranged over the substrate 100 to correspond to the first touch insulating layer 403, the second touch insulating layer 405 may be patterned. For example, the second touch insulating layer 405 may be patterned to include an opening overlapping the emission area EA.

According to some embodiments, the second touch insulating layer 405 may include acryl-based resin (e.g., polymethyl methacrylate or polyacrylic acid), ethylhexyl acrylate, pentafluoropropyl acrylate, poly(ethylene glycol) dimethacrylate, or ethylene glycol dimethacrylate. According to some embodiments, the second touch insulating layer 405 may further include a photo curing agent and/or a thermal curing agent such as epoxy.

The lower light blocking pattern LBLp1 may be arranged on the encapsulation layer 300. As illustrated in FIG. 6, the lower light blocking pattern LBLp1 may be arranged on the second touch insulating layer 405.

Although FIG. 6 illustrates that the lower light blocking pattern LBLp1 is arranged on the second touch insulating layer 405, the lower light blocking pattern LBLp1 may cover at least one of the first touch conductive layer CTL1 or the second touch conductive layer CTL2. For example, the lower light blocking pattern LBLp1 may cover the second touch conductive layer CTL2. As another example, the lower light blocking pattern LBLp1 may cover the first touch conductive layer CTL1. As another example, the lower light blocking pattern LBLp1 may cover the first touch conductive layer CTL1 and the second touch conductive layer CTL2.

As another example, the lower light blocking pattern LBLp1 may be arranged on the pixel definition layer 225. The lower light blocking pattern LBLp1 may be spaced apart from the emission area EA. Thus, light may be emitted from the organic light emitting diode (OLED) to the outside.

As another example, the lower light blocking pattern LBLp1 may be arranged under the second touch insulating layer 405. The second touch insulating layer 405 may cover the lower light blocking pattern LBLp1. That is, the second touch insulating layer 405 may be between the lower light blocking pattern LBLp1 and the organic layer 407.

The lower light blocking pattern LBLp1 may include a black pigment. The lower light blocking pattern LBLp1 may at least partially absorb external light or internal reflected light. The lower light blocking pattern LBLp1 may include a black matrix.

The lower light blocking pattern LBLp1 may include a first opening portion LBLop1 overlapping the emission area EA of the organic light emitting diode OLED. The lower light blocking pattern LBLp1 may include a first opening portion LBLop1 corresponding to the first partial pixel PXp1. Although the description has been given with respect to the first partial pixel PXp1, the lower light blocking pattern LBLp1 may include first opening portions LBLop1 respectively corresponding to the second partial pixel PXp2 and the third partial pixel PXp3. In some cases, the lower light blocking pattern LBLp1 may be omitted.

According to some embodiments, a color filter may be further arranged on the first touch insulating layer 403. The color filter may overlap the emission area EA. In this case, the lower light blocking pattern LBLp1 and the color filter may function as the anti-reflection layer 500 (see FIG. 3B).

The organic layer 407 may be arranged on the second touch insulating layer 405. The organic layer 407 may cover the lower light blocking pattern LBLp1. According to some embodiments, when the second touch insulating layer 405 includes an opening overlapping the emission area EA, the organic layer 407 may fill the opening of the second touch insulating layer 405.

According to some embodiments, a thickness 407d of the organic layer 407 may be greater than a thickness 405d of the second touch insulating layer 405. According to some embodiments, the thickness 407d of the organic layer 407 may be greater than a thickness 320d of the organic encapsulation layer 320. The thickness 407d of the organic layer 407 may be the distance between the upper surface of the organic layer 407 and the lower surface of the organic layer 407 in a fifth direction (e.g., ±z direction). The thickness 405d of the touch insulating layer 405 may be the distance from the upper surface of the second touch insulating layer 405 to the lower surface of the second touch insulating layer 405 in the fifth direction (e.g., ±z direction). The thickness 320d of the organic encapsulation layer 320 may be the distance from the upper surface of the first inorganic encapsulation layer 310 to the upper surface of the organic encapsulation layer 320 in the fifth direction (e.g., ±z direction). According to some embodiments, the thickness 407d of the organic layer 407 may be about 20 μm or more.

According to some embodiments, the organic layer 407 may include an acryl-based or siloxane-based organic material. In some embodiments, the organic layer 407 may include polydiarylsiloxane, methyltrimethoxysilane, tetramethoxysilane, or the like. According to some embodiments, the organic layer 407 may be formed by applying a material thereof through an inkjet printing process and then curing the same. In other embodiments, the organic layer 407 may be formed through an evaporation process.

According to some embodiments, metal oxide particles such as zinc oxide (ZnO), titanium oxide ($TiO_2$), zirconium oxide ($ZrO_2$), or barium titanate ($BaTiO_3$) may be distributed in the organic layer 407. According to some embodiments, the organic layer 407 may be formed by applying an organic material including metal oxide particles by using inkjet. According to some embodiments, the refractive index of the organic layer 407 may be greater than the refractive index of the second touch insulating layer 405.

The inorganic layer 409 may be arranged on the organic layer 407. A thickness 409d of the inorganic layer 409 may be less than the thickness 407d of the organic layer 407. The thickness 409d of the inorganic layer 409 may be the distance between the upper surface of the inorganic layer 409 and the lower surface of the inorganic layer 409 in the fifth direction (e.g., ±z direction). According to some embodiments, the thickness 409d of the inorganic layer 409 may be about 0.05 μm to about 0.5 μm. The inorganic layer 409 may include an inorganic insulating material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), and hafnium oxide ($HfO_2$), or zinc oxide (ZnO). The inorganic layer 409 may prevent or reduce damage to the organic layer 407 arranged under the inorganic layer 409 when the upper light blocking pattern LBLp2 is formed over the inorganic layer 409.

The upper light blocking pattern LBLp2 may be arranged on the inorganic layer 409. The upper light blocking pattern LBLp2 may be arranged on the pixel definition layer 225. The upper light blocking pattern LBLp2 may be spaced apart from the emission area EA. Thus, light may be emitted from the organic light emitting diode (OLED) to the outside.

According to some embodiments, the upper light blocking pattern LBLp2 may overlap the lower light blocking pattern LBLp1. For example, the upper light blocking pattern LBLp2 may at least partially overlap the lower light blocking pattern LBLp1. The upper light blocking pattern LBLp2 may be arranged on the lower light blocking pattern LBLp1. According to some embodiments, the upper light blocking pattern LBLp2 may be spaced apart from the lower light blocking pattern LBLp1. According to some embodiments, the upper light blocking pattern LBLp2 may be spaced apart from the lower light blocking pattern LBLp1 by the organic layer 407.

The upper light blocking pattern LBLp2 may include a black pigment similarly to the lower light blocking pattern LBLp1. The upper light blocking pattern LBLp2 may at least partially absorb external light or internal reflected light. The upper light blocking pattern LBLp2 may include a black matrix.

The upper light blocking pattern LBLp2 may include a second opening portion LBLop2 overlapping the emission area EA of the organic light emitting diode OLED. The upper light blocking pattern LBLp2 may include a second opening portion LBLop2 corresponding to the first partial pixel PXp1. Although the description has been given with respect to the first partial pixel PXp1, the upper light blocking pattern LBLp2 may include second opening portions LBLop2 respectively corresponding to the second partial pixel PXp2 and the third partial pixel PXp3.

Unlike the light blocking pattern LBLp, each of the encapsulation layer 300, the touch buffer layer 401, the first touch insulating layer 403, the second touch insulating layer 405, the organic layer 407, and the inorganic layer 409 may transmit the light emitted from the organic light emitting diode OLED. Each of the encapsulation layer 300, the touch buffer layer 401, the first touch insulating layer 403, the second touch insulating layer 405, the organic layer 407, and the inorganic layer 409 may be referred to as a transmission layer.

The planarization layer 411 may be arranged on the inorganic layer 409 and the upper light blocking pattern LBLp2. The planarization layer 411 may cover the upper light blocking pattern LBLp2. The upper surface of the planarization layer 411 may be substantially flat and may include an organic material such as acryl, benzocyclobutene (BCB), or hexamethyldisiloxane (HMDSO).

The lower light blocking pattern LBLp1 and the upper light blocking pattern LBLp2 may be for reducing the propagation of the light emitted from the organic light emitting diode OLED in a direction inclined to the front of the display panel 10.

Referring to FIG. 7, the light emitted from the organic light emitting diode OLED may be emitted in the fifth direction (e.g., ±z direction) perpendicular to the front of the substrate 100. Also, the light emitted from the organic light emitting diode OLED may be emitted in a direction inclined to the front of the substrate 100 for various reasons. For example, the light emitted from the organic light emitting diode OLED may propagate in a direction inclined to the front of the substrate 100 for reasons such as refraction and/or reflection. Here, the inclined direction may be a direction intersecting with the fifth direction (e.g., ±z direction). In this case, the light emitted from the organic light emitting diode OLED may reach not only the user using the display apparatus, but also other persons around the user. Thus, information provided by the display apparatus may be shared with the other persons.

At least one of the lower light blocking pattern LBLp1 and the upper light blocking pattern LBLp2 may reduce the emission of the light emitted from the organic light emitting diode OLED in a direction inclined to the front of the substrate 100 and/or the display panel 10. For example, at least one of the lower light blocking pattern LBLp1 or the upper light blocking pattern LBLp2 may at least partially absorb the light propagating in a direction inclined to the front of the substrate 100, among the light emitted from the organic light emitting diode OLED.

According to some embodiments, the thickness 407d of the organic layer 407 may be greater than the thickness 405d of the second touch insulating layer 405 and/or the thickness 320d of the organic encapsulation layer 320. Thus, the upper light blocking pattern LBLp2 may be arranged further away from the organic light emitting diode OLED. In this case, the upper light blocking pattern LBLp2 may reduce the emission of the light emitted from the organic light emitting diode OLED in a direction inclined to the front of the substrate 100 and/or the display panel 10. Thus, as for the light emitted from the organic light emitting diode OELD, the light propagating in a direction intersecting with the fifth direction (e.g., ±z direction) may be at least partially removed. Thus, the light emitted from the display panel 10 may generally propagate in the fifth direction (e.g., z direction).

The organic layer 407 may separate the lower light blocking pattern LBLp1 and the upper light blocking pattern LBLp2 from each other. According to some embodiments, the lower light blocking pattern LBLp1 may primarily at least partially absorb the light propagating in a direction intersecting with the fifth direction (e.g., ±z direction). Also, the upper light blocking pattern LBLp2 may secondarily absorb the light propagating in a direction intersecting with the fifth direction (e.g., ±z direction). Thus, the light emitted from the display panel 10 may generally propagate in the fifth direction (e.g., ±z direction).

Figure 8:
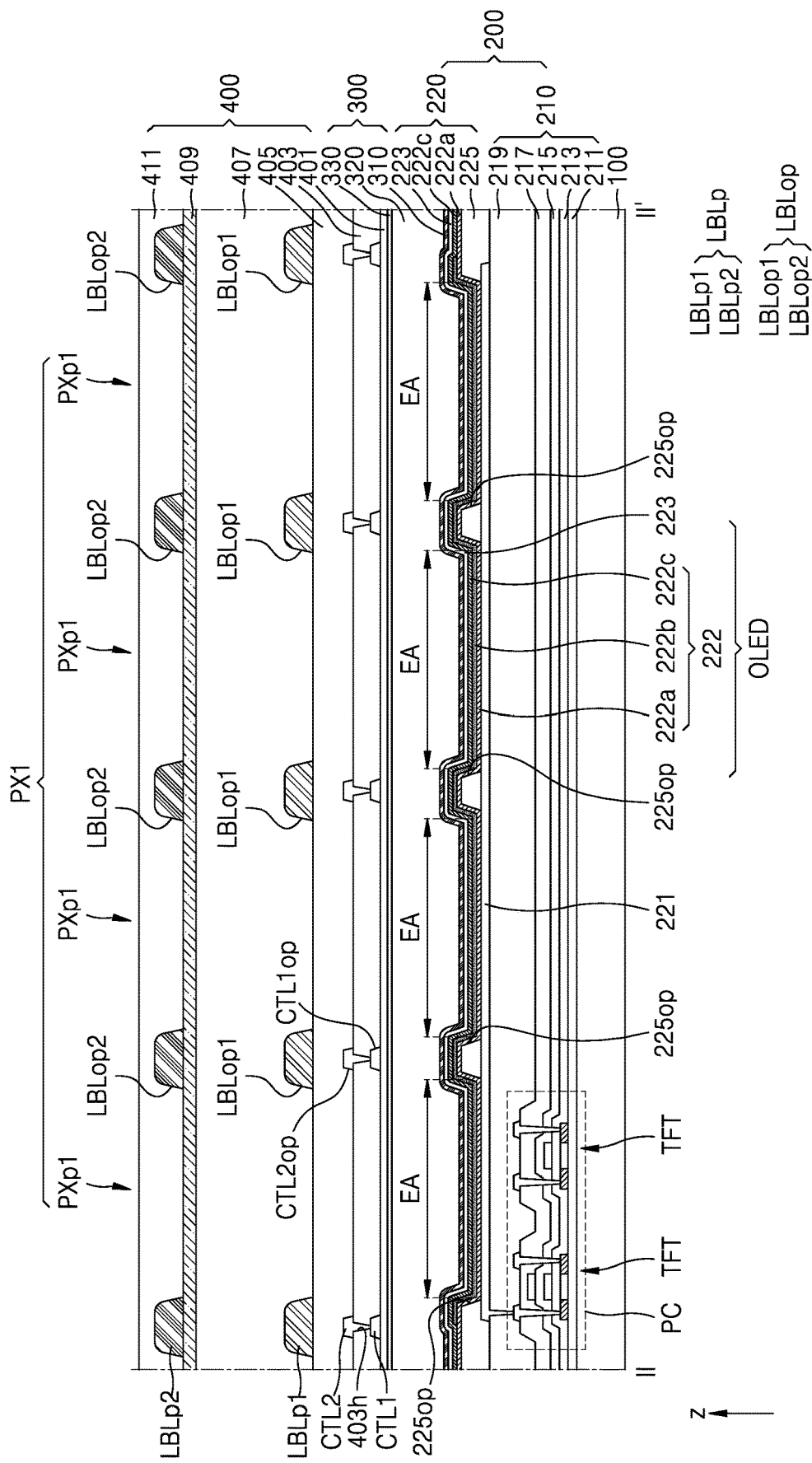
FIG. 8 is an example of a cross-sectional view of a plurality of first partial pixels taken along the line II-II' of FIG. 5.

FIG. 8 is an example of a cross-sectional view of a plurality of first partial pixels taken along the line II-II' of FIG. 5. In FIG. 8, like reference numerals as those in FIGS. 5 and 6 denote like members, and thus redundant descriptions thereof will be omitted for conciseness Referring to FIG. 8, the plurality of first partial pixels PXp1 included in one first pixel PX1 among the plurality of first pixels PX1 may be commonly driven. The plurality of first partial pixels PXp1 included in one first pixel PX1 among the plurality of first pixels PX1 may be commonly driven through one pixel circuit PC.

As illustrated in FIG. 8, the pixel electrode 221 may be electrically connected to the pixel circuit PC through a contact hole formed in the organic insulating layer 219. The pixel definition layer 225 may have a plurality of openings 225op exposing at least a portion of the pixel electrode 221.

The first functional layer 222a, the emission layer 222b, and the second functional layer 222c may be sequentially arranged on the pixel electrode 221 and the pixel definition layer 225.

The emission layer 222b may be integrally formed corresponding to the plurality of openings 225op. Because the emission layer 222b may be formed by using a mask M of FIG. 10 described below, it may correspond to a first opening Mop1 of the mask M. In the plan view, the shape of the emission layer 222b may be substantially the same as the shape of the first opening Mop1 of the mask M.

The lower light blocking pattern LBLp1 and the upper light blocking pattern LBLp2 may be arranged on the plurality of first partial pixels PXp1.

The lower light blocking pattern LBLp1 may include a first opening portion LBLop1 overlapping the emission area EA of the organic light emitting diode OLED. The lower light blocking pattern LBLp1 may include a plurality of first opening portions LBLop1 respectively corresponding to the plurality of first partial pixels PXp1.

The upper light blocking pattern LBLp2 may include a second opening portion LBLop2 overlapping the emission area EA of the organic light emitting diode OLED. The upper light blocking pattern LBLp2 may include a plurality of second opening portions LBLop2 respectively corresponding to the plurality of first partial pixels PXp1.

Although the description has been given with respect to the plurality of first partial pixels PXp1 included in one first pixel PX1 among the plurality of first pixels PX1, the plurality of second partial pixels PXp2 included in one third pixel PX3 among the plurality of third pixels PX3 and the plurality of third partial pixels PXp3 included in one fifth pixel PX5 among the plurality of fifth pixels PX5 may also be similarly applied.

FIGS. 9A to 9D are enlarged plan views schematically illustrating a first pixel according to other embodiments.

Referring to FIGS. 9A to 9D, the first pixel PX1 may include a plurality of first partial pixels PXp1. The number of the plurality of first partial pixels PXp1 included in the first pixel PX1 may be variously modified.

Figure 9A:
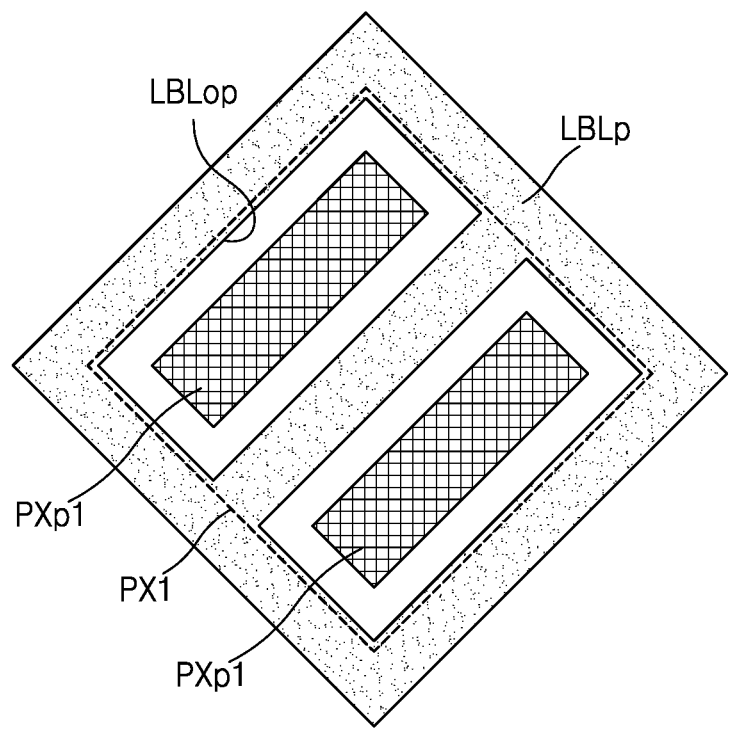
FIGS. 9A to 9D are enlarged plan views schematically illustrating a first pixel according to some embodiments.
Figure 9B:
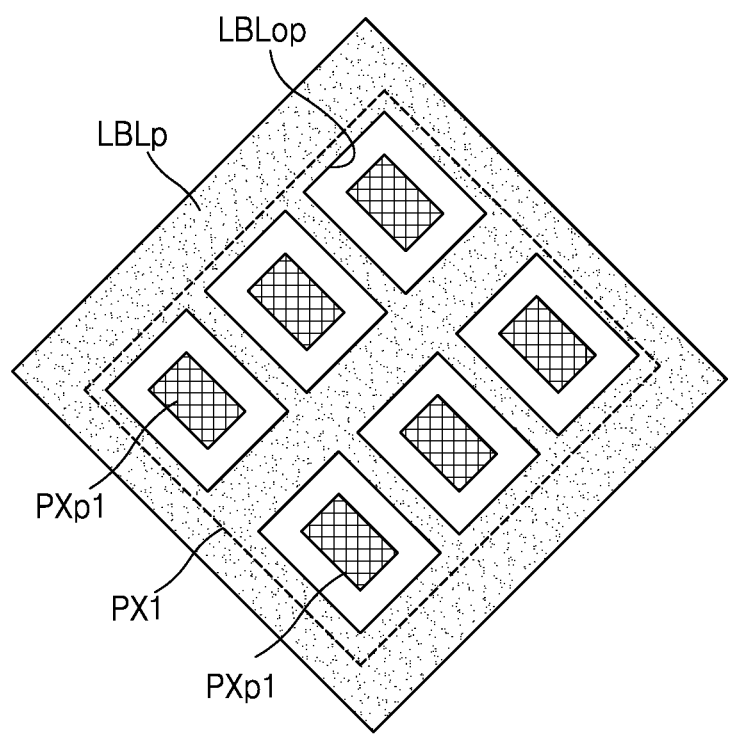
Figure 9C:
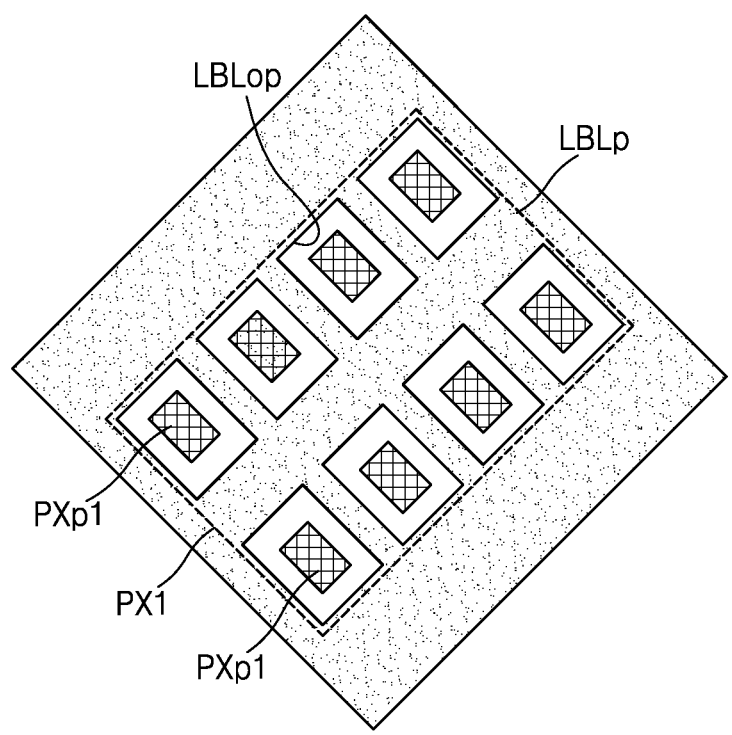
Figure 9D:
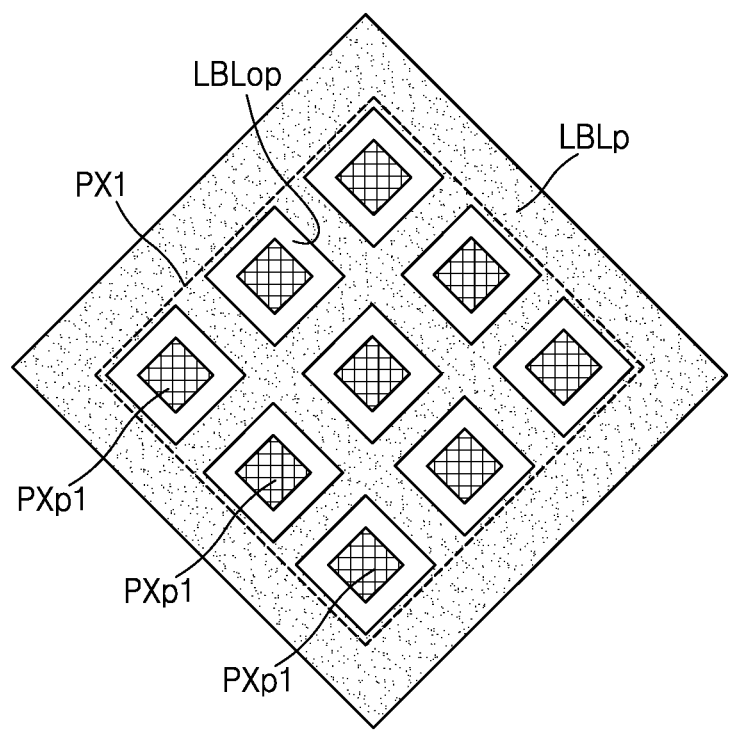

As illustrated in FIG. 9A, the first pixel PX1 may include two first partial pixels PXp1. As another example, the first pixel PX1 may include six first partial pixels PXp1 as illustrated in FIG. 9B, may include eight first partial pixels as illustrated in FIG. 9C, or may include nine first partial pixels PXp1 as illustrated in FIG. 9D. As such, the number of the plurality of first partial pixels PXp1 included in the first pixel PX1 may be variously modified.

The light blocking pattern LBLp over the first pixel PX1 may include opening portions LBLop respectively corresponding to the plurality of first partial pixels PXp1. The light blocking pattern LBLp over the first pixel PX1 may include opening portions LBLop in proportion to the number of the plurality of first partial pixels PXp1 included in the first pixel PX1.

For example, as illustrated in FIG. 9A, when the total number of the plurality of first partial pixels PXp1 included in the first pixel PX1 is two, the total number of the opening portions LBLop of the light blocking pattern LBLp may also be two. As another example, as illustrated in FIG. 9B, when the total number of the plurality of first partial pixels PXp1 included in the first pixel PX1 are six, the total number of the opening portions LBLop of the light blocking pattern LBLp may also be six, and as illustrated in FIG. 9C, when the total number of the plurality of first partial pixels PXp1 included in the first pixel PX1 are eight, the total number of the opening portions LBLop of the light blocking pattern LBLp may also be eight. As another example, as illustrated in FIG. 9d, when the total number of the plurality of first partial pixels PXp1 included in the first pixel PX1 is nine, the total number of the opening portions LBLop of the light blocking pattern LBLp may also be nine.

Although the description has been given with respect to the plurality of first partial pixels PXp1 included in one first pixel PX1 among the plurality of first pixels PX1, the plurality of second partial pixels PXp2 included in one third pixel PX3 among the plurality of third pixels PX3 and the plurality of third partial pixels PXp3 included in one fifth pixel PX5 among the plurality of fifth pixels PX5 may also be similarly applied.

Figure 10:
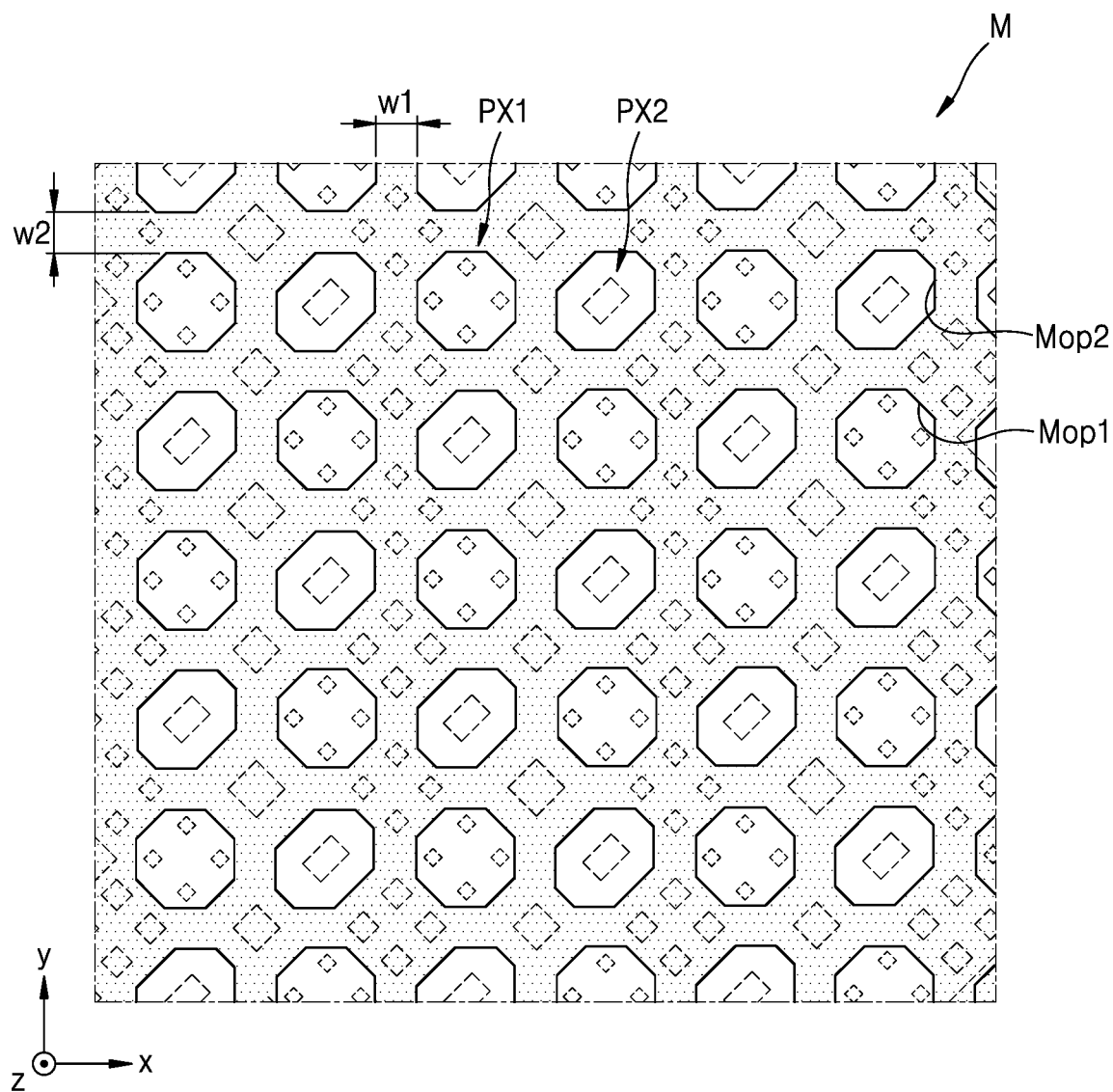
FIG. 10 is a plan view schematically illustrating an example of a mask for forming an emission layer.

FIG. 10 is a plan view schematically illustrating an example of a mask for forming an emission layer.

Particularly, FIG. 10 schematically illustrates a mask M for forming the emission layer 222b (see FIG. 8) corresponding to each of the plurality of first pixels PX1 and the plurality of second pixels PX2 emitting light of the first color.

Referring to FIG. 10, the mask M for forming the emission layer 222b may include a plurality of first openings Mop1 and a plurality of second openings Mop2. In this case, the plurality of first openings Mop1 may respectively correspond to the plurality of first pixels PX1, and the plurality of second openings Mop2 may respectively correspond to the plurality of second pixels PX2.

A first gap w1 between the first opening Mop1 and the second opening Mop2 adjacent in the first direction (e.g., ±x direction) among the plurality of first openings Mop1 and the plurality of second openings Mop2 may be uniform. Through the uniform first gap w1, the plurality of first pixels PX1 and the plurality of second pixels PX2 may be formed at certain intervals in the first direction (e.g., ±x direction).

A second gap w2 between the first opening Mop1 and the second opening Mop2 adjacent in the second direction (e.g., ±y direction) among the plurality of first openings Mop1 and the plurality of second openings Mop2 may be uniform. Through the uniform second gap w2, the plurality of first pixels PX1 and the plurality of second pixels PX2 may be formed at certain intervals in the second direction (e.g., ±y direction).

As a comparative example, a plurality of openings included in a mask for forming an emission layer may not be formed at uniform intervals. In this case, the distances between the plurality of openings may be different from each other, and the distance between some of the plurality of openings may be very small and thus it may be difficult to manufacture the mask. Also, the distances between the pixels formed through the mask may also different from each other, and thus the pixels may be arranged at nonuniform intervals and the uniformity thereof may be lowered.

However, the mask M according to some embodiments may include a plurality of first openings Mop1 and a plurality of second openings Mop2 that are respectively arranged at uniform intervals in the first direction (e.g., ±x direction) and the second direction (e.g., ±y direction). The plurality of first pixels PX1 and the plurality of second pixels PX2 formed by using the mask M may also be respectively formed at certain intervals in the first direction (e.g., x direction) and the second direction (e.g., ±y direction). Because the plurality of first pixels PX1 and the plurality of second pixels PX2 emitting the same color may be formed at certain intervals, the uniformity may increase and the color shift may be improved. Also, because the first gap w1 and the second gap w2 between the first opening Mop1 and the second opening Mop2 of the mask M may be sufficiently formed, the defect rate of the mask M may be reduced when the mask M is manufactured.

Although only the display apparatus has been mainly described above, embodiments according to the present disclosure are not limited thereto. For example, a display apparatus manufacturing method for manufacturing the display apparatus may also fall within the scope of the disclosure.

As described above, according to some embodiments, a display apparatus in which a manufacturing defect rate of a deposition mask used to form an emission layer of a display element may be reduced and propagation of light emitted from the display element in a direction inclined to the front of the display apparatus may be reduced may be implemented. However, the scope of embodiments according to the present disclosure are not limited to these effects.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims, and their equivalents.

What is claimed is:

1. A display apparatus comprising:
   a substrate;
   a plurality of first pixels on the substrate arranged along a first direction and a second direction and configured to emit light of a first color; and
   a plurality of second pixels arranged on the substrate arranged along the first direction and the second direction and configured to emit light of the first color;
   a transmission layer on the plurality of first pixels and the plurality of second pixels; and
   a light blocking layer on the transmission layer, the light blocking layer including light blocking patterns,
   wherein each of the plurality of first pixels includes a plurality of first partial pixels,
   wherein the plurality of first pixels and the plurality of second pixels are alternately arranged in each of the first direction and the second direction,
   wherein the light blocking patterns are arranged in a first area in which the plurality of first pixels are arranged, and each of the light blocking patterns has a zigzag shape with alternating arrangements of first portions extending along a third direction and second portions extending along a fourth direction,
   wherein the first direction, the second direction, the third direction and the fourth direction intersect with each other, and
   wherein the first color is green.

2. The display apparatus of claim 1, wherein a light emission area of each of the plurality of first partial pixels is less than a light emission area of each of the plurality of second pixels in a plan view.

3. The display apparatus of claim 1, wherein a sum of amounts of light of the first color emitted, in response to a signal corresponding to a first gray scale value being input to one first pixel among the plurality of first pixels, by a plurality of first partial pixels included in the one first pixel is equal to a sum of amounts of light of the first color emitted, in response to a signal corresponding to the first gray scale value being input to one second pixel among the plurality of second pixels, by the one second pixel.

4. The display apparatus of claim 1, wherein a first gap of the plurality of first pixels in the first direction is equal to a second gap of the plurality of second pixels in the first direction.

5. The display apparatus of claim 4, wherein a third gap of the plurality of first pixels in the second direction are equal to a fourth gap of the plurality of second pixels in the second direction.

6. The display apparatus of claim 1, further comprising a plurality of first pixel circuits respectively configured to drive the plurality of first pixels,
   wherein each of the plurality of first pixel circuits are configured to commonly drive a plurality of first partial pixels included in a corresponding first pixel among the plurality of first pixels.

7. The display apparatus of claim 6, further comprising a plurality of second pixel circuits respectively configured to drive the plurality of second pixels,
   wherein each of the plurality of first pixel circuits and the plurality of second pixel circuits includes a driving transistor having a same channel characteristic.

8. The display apparatus of claim 1, further comprising:
   a plurality of third pixels on the substrate arranged along the first direction and the second direction and configured to emit light of a second color; and
   a plurality of fourth pixels on the substrate arranged along the first direction and the second direction and configured to emit light of the second color, wherein each of the plurality of third pixels includes a plurality of second partial pixels, and the plurality of third pixels and the plurality of fourth pixels are respectively arranged between two first pixels adjacent in the third direction among the plurality of first pixels and are alternately arranged in the third direction.

9. The display apparatus of claim 8, wherein a first gap of the plurality of third pixels in the first direction is equal to a second gap of the plurality of fourth pixels in the first direction, and a third gap of the plurality of third pixels in the second direction is equal to a fourth gap of the plurality of fourth pixels in the second direction.

10. The display apparatus of claim 8, further comprising:

a plurality of third pixel circuits respectively configured to drive the plurality of third pixels; and a plurality of fourth pixel circuits configured to drive the plurality of fourth pixels, wherein each of the plurality of third pixel circuits are configured to commonly drive a plurality of second partial pixels included in a corresponding third pixel among the plurality of third pixels, and the plurality of fourth pixel circuits have a same circuit configuration as the plurality of third pixel circuits.

11. The display apparatus of claim 8, further comprising:

a plurality of fifth pixels on the substrate arranged along the first direction and the second direction and configured to emit light of a third color; and a plurality of sixth pixels on the substrate arranged along the first direction and the second direction and configured to emit light of the third color, wherein each of the plurality of fifth pixels includes a plurality of third partial pixels, and the plurality of fifth pixels and the plurality of sixth pixels are respectively arranged between two first pixels adjacent in the fourth direction among the plurality of first pixels and are alternately arranged in the fourth direction.

12. The display apparatus of claim 11, wherein the plurality of third pixels and the plurality of fifth pixels are alternately arranged along the first direction, the plurality of fourth pixels and the plurality of sixth pixels are arranged along the first direction, the plurality of third pixels and the plurality of sixth pixels are alternately arranged along the second direction, and the plurality of fourth pixels and the plurality of fifth pixels are alternately arranged along the second direction.

13. The display apparatus of claim 1, further comprising a controller configured to receive an input of a signal for selecting an operation mode, driving the plurality of first pixels and the plurality of second pixels in response to the operation mode being a first mode, and driving the plurality of first pixels and deactivating the plurality of second pixels in response to the operation mode being a second mode.

14. The display apparatus of claim 1, wherein each of the light blocking patterns includes a plurality of opening portions respectively corresponding to the plurality of first partial pixels.

15. The display apparatus of claim 14, wherein the light blocking patterns do not overlap a second area in which the plurality of second pixels are arranged.

16. The display apparatus of claim 14, wherein the light blocking patterns extend in the first direction and are spaced apart from each other in the second direction.

17. A display apparatus comprising:

a plurality of first pixels comprising a first pixel configured to emit light of a first color and including a plurality of first partial pixels that are commonly driven;

a plurality of second pixels comprising a second pixel configured to emit light of the first color;

a third pixel configured to emit light of a second color and including a plurality of second partial pixels that are commonly driven;

a fourth pixel configured to emit light of the second color;

a fifth pixel configured to emit light of a third color and including a plurality of third partial pixels that are commonly driven;

a sixth pixel configured to emit light of the third color;

a transmission layer on the first pixel to sixth pixels; and a light blocking layer on the transmission layer, the light blocking layer including light blocking patterns, wherein the plurality of first pixels and the plurality of second pixels are alternately arranged in each of a first direction and a second direction, wherein the light blocking patterns are arranged in a first area in which the first pixel, the third pixel, and the fifth pixel are arranged, and each of the light blocking patterns has a zigzag shape with alternating arrangements of first portions extending along a third direction and second portions extending along a fourth direction, and wherein the first direction, the second direction, the third direction and the fourth direction intersect with each other.

18. The display apparatus of claim 17, further comprising a controller configured to receive an input of a signal for selecting an operation mode, driving the first pixel, the second pixel, the third pixel, the fourth pixel, the fifth pixel, and the sixth pixel in response to the operation mode being a first mode, and driving the first pixel, the third pixel, and the fifth pixel and deactivating the second pixel, the fourth pixel, and the sixth pixel in response to the operation mode being a second mode.

19. The display apparatus of claim 17, wherein the first pixel and the second pixel are adjacent in the first direction, the third pixel and the sixth pixel are adjacent in the first direction, and the fifth pixel and the fourth pixel are adjacent in the first direction.

20. The display apparatus of claim 19, wherein the first pixel or the second pixel is between the third pixel and the fourth pixel and is between the fifth pixel and the sixth pixel.

21. The display apparatus of claim 17, wherein each of the light blocking patterns includes a plurality of openings respectively corresponding to the plurality of first partial pixels, the plurality of second partial pixels, and the plurality of third partial pixels.

22. The display apparatus of claim 21, wherein the light blocking patterns do not overlap a second area in which the second pixel, the fourth pixel, and the sixth pixel are arranged.

* * * * *